United States Patent
Dong et al.

(10) Patent No.: US 9,224,452 B2
(45) Date of Patent: Dec. 29, 2015

(54) HETEROGENEOUS MEMORY SYSTEMS, AND RELATED METHODS AND COMPUTER-READABLE MEDIA FOR SUPPORTING HETEROGENEOUS MEMORY ACCESS REQUESTS IN PROCESSOR-BASED SYSTEMS

(71) Applicant: QUALCOMM Incorporated, San Diego, CA (US)

(72) Inventors: Xiangyu Dong, La Jolla, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 206 days.

(21) Appl. No.: 13/743,400

(22) Filed: Jan. 17, 2013

(65) Prior Publication Data

US 2014/0201435 A1    Jul. 17, 2014

(51) Int. Cl.
  *G06F 13/16*      (2006.01)
  *G06F 12/08*      (2006.01)
  *G11C 11/406*     (2006.01)

(52) U.S. Cl.
  CPC .......... *G11C 11/40603* (2013.01); *G06F 12/08* (2013.01); *G06F 13/1694* (2013.01); *Y02B 60/1228* (2013.01)

(58) Field of Classification Search
  CPC ............ G06F 12/0246; G06F 13/1668; G06F 2212/205; G06F 13/14; G06F 13/1694; G06F 15/16; G06F 11/2025; G06F 11/2035; G06F 11/2097; G06F 12/0638; G06F 2217/78; G06F 3/0659; G06F 3/1431
  USPC ........ 710/8–9, 36–37, 39; 711/100, 111, 112, 711/115
  See application file for complete search history.

(56) References Cited

U.S. PATENT DOCUMENTS

| | | | |
|---|---|---|---|
| 6,292,874 B1 | 9/2001 | Barnett | |
| 6,530,007 B2 | 3/2003 | Olarig et al. | |
| 6,853,382 B1 * | 2/2005 | Van Dyke et al. | ............ 345/544 |
| 7,685,376 B2 | 3/2010 | Zimmer et al. | |
| 7,970,980 B2 | 6/2011 | Hillier, III | |

(Continued)

OTHER PUBLICATIONS

International Search Report and Written Opinion—PCT/US2014/011442—ISA/EPO—Apr. 1, 2014.

(Continued)

*Primary Examiner* — Zhuo Li
(74) *Attorney, Agent, or Firm* — Withrow & Terranova, PLLC

(57) ABSTRACT

Heterogeneous memory systems, and related methods and computer-readable media for supporting heterogeneous memory access requests in processor-based systems are disclosed. A heterogeneous memory system is comprised of a plurality of homogeneous memories that can be accessed for a given memory access request. Each homogeneous memory has particular power and performance characteristics. In this regard, a memory access request can be advantageously routed to one of the homogeneous memories in the heterogeneous memory system based on the memory access request, and power and/or performance considerations. The heterogeneous memory access request policies may be predefined or determined dynamically based on key operational parameters, such as read/write type, frequency of page hits, and memory traffic, as non-limiting examples. In this manner, memory access request times can be optimized to be reduced without the need to make tradeoffs associated with only having one memory type available for storage.

50 Claims, 17 Drawing Sheets

(56) References Cited

U.S. PATENT DOCUMENTS

2003/0229744 A1    12/2003  Moss
2007/0033367 A1     2/2007  Sakarda et al.
2007/0260827 A1*   11/2007  Zimmer et al. ............... 711/154
2008/0082751 A1*    4/2008  Okin et al. ................... 711/115
2009/0113112 A1     4/2009  Ye et al.
2009/0132736 A1*    5/2009  Hasan et al. .................. 710/56
2012/0089759 A1*    4/2012  Shirlen et al. ................ 710/113

OTHER PUBLICATIONS

Written Opinion for PCT/US2014/011442, mailed Jan. 30, 2015, 7 pages.
International Preliminary Report on Patentability for Patent Application No. PCT/US2014/011442, mailed May 4, 2015, 7 pages.

* cited by examiner

Master Device 12
& Application
Policy Table
Update

Operation Mode Indicator (104)

Heterogeneous MAR_Policy Message Block (108)

| Master_ID 110 | Application_ID 112 | Memory Type 114 | Power_off_reset 116 |
|---|---|---|---|

Heterogeneous MAR_Policy Table (36)

| Master_ID 110 | Application_ID 112 | Memory Type 114 | Power_off_reset 116 |
|---|---|---|---|
| CPU | 0 | VM | N |
| CPU | 1 | NVM | Y |
| MDP | 0 | NVM | N |
| | | | |

MAR_Queue
146

| QUEUE # | MASTER_ID | ADDRESS | DATA | MAR Block | STREAM_ID | #_TRANS_REMAIN | RANK | WEIGHT |
| --- | --- | --- | --- | --- | --- | --- | --- | --- |
| 148 | 110 | 149 | 150 | 118 | 124 | 152 | 154 | 156 |
| 1 | Master_ID1 | 0x3FFFFFFF | Data1 | MAR Block1 | STREAM_ID | 4 | 1 | 1 |
| 2 | Master_ID2 | 0x2FFFFFFF | Data2 | MAR Block2 | STREAM_ID | 98 | 2 | 1 |
| 3 | Master_ID3 | 0x02000000 | Data3 | MAR Block3 | STREAM_ID | 1 | 3 | 2 |

FIG. 9B

MAR Dynamic Profile Table

| MSTR_ID /APP# | PROFILE_VALID | MSTR_ID | APPLICATION_ID | PRIORITY | DEADLINE | POWER PRIORITY | R/W PRIORITY | PAGE HIT RATIO | MEMORY TRAFFIC |
|---|---|---|---|---|---|---|---|---|---|
| 1 | Master_ID$_1$ | 0x01 | App_ID$_2$ | H | 350ms | H | H | .73 | 120K |
| 2 | Master_ID$_2$ | 0x01 | App_ID$_2$ | H | X | X | L | 5.4 | 98K |
| 3 | Master_ID$_3$ | 0x02 | App_ID$_1$ | X | X | L | X | 1.23 | 325K |
| | | | | | | | | | |

FIG. 14

HETEROGENEOUS MEMORY SYSTEMS, AND RELATED METHODS AND COMPUTER-READABLE MEDIA FOR SUPPORTING HETEROGENEOUS MEMORY ACCESS REQUESTS IN PROCESSOR-BASED SYSTEMS

BACKGROUND

I. Field of the Disclosure

The technology of the disclosure relates to memory and memory systems provided in processor-based systems and devices.

II. Background

Processor-based systems that include a central processing unit (CPU) or other processors utilize memory of varying types for system operations. This memory may be used as system memory for data storage and to store program code for storing instructions to be executed.

Memory is either generally categorized as volatile or non-volatile memory. An example of volatile memory is Dynamic Random Access Memory (DRAM). Examples of non-volatile memory include Read Only Memory (ROM), Flash memory, Static Random Access Memory (SRAM), and Magnetoresistive Random Access Memory (MRAM). Volatile memory may require that power be expended to refresh memory cells and keep a current state (i.e. data) active and retained in the memory cells. Non-volatile memory may be capable of retaining a current state (i.e., data) in memory cells without need for refreshing. Thus, volatile memory may consume more power than non-volatile memory. However, volatile memory may have increased performance characteristics over non-volatile memory, including but not limited to, increased read/write (r/w) speeds and page opening and/or closing speeds.

Thus, volatile memory may be advantageously employed in processor-based systems wherein increased performance is an acceptable tradeoff for higher power consumption for refreshing. On the other hand, non-volatile memory may be advantageously employed in processor-based systems where reduced power conservation is an acceptable tradeoff to performance.

SUMMARY OF THE DISCLOSURE

Embodiments disclosed in the detailed description include heterogeneous memory systems, and related methods and computer-readable media for supporting heterogeneous memory access requests in processor-based systems. A heterogeneous memory system is comprised of a plurality of homogeneous memories that can be accessed for a given memory access request. For example, one homogeneous memory in the heterogeneous memory system may be volatile memory requiring power for refreshing, but having increased performance over non-volatile memory. As a further example, another homogeneous memory in the heterogeneous memory system may be non-volatile memory not requiring power for refreshing, but having reduced performance over non-volatile memory. In this regard, a memory access request can be advantageously routed to one of the homogeneous memories in the heterogeneous memory system based on the memory access request, and power and/or performance considerations. Heterogeneous memory access request policies may be predefined or determined dynamically based on key operational parameters, such as read/write type, frequency of page hits, and memory traffic, as non-limiting examples. In this manner, memory access request times can be optimized without the need to make tradeoffs associated with having only one memory type available for storage.

In this regard in one embodiment, a bus interconnect arbiter is provided. The bus interconnect arbiter is configured to route memory access requests in a bus interconnect to a heterogeneous memory system in a processor-based system. The bus interconnect arbiter is configured to receive a memory access request from a requesting device. The bus interconnect arbiter is further configured to determine a memory access request policy among a plurality of heterogeneous memory access request policies, each heterogeneous memory access request policy among the plurality of heterogeneous memory access request policies corresponding to a homogeneous memory within the heterogeneous memory system coupled to the bus interconnect. The bus interconnect arbiter is further configured to route the memory access request to the homogeneous memory in the heterogeneous memory system coupled to the bus interconnect corresponding to the determined memory access request policy.

Also, by providing a heterogeneous memory system that would otherwise be a homogeneous memory system, the system design can take advantage of the unique power and performance characteristics of each unique homogeneous memory within the heterogeneous memory system without be limiting to a single, homogeneous memory. Further, because the homogeneous memories within the heterogeneous memory system are coupled to the same bus interconnect, the providing of heterogeneous memory system can be transparent to the requesting device of the memory access request. In other words, the requesting device can provide memory access requests that do not require prior knowledge or special settings for memory requests. This can have an additional advantage of not requiring an architecture change in either a processor-based system employing a heterogeneous memory system disclosed herein and/or requesting devices that provide memory access requests over the bus interconnect in the processor-based system.

In another embodiment, a bus interconnect arbiter for routing memory access requests to a heterogeneous memory system in a processor-based system is provided. The bus interconnect arbiter comprises a means for receiving a memory access request in a bus interconnect from a requesting device. The bus interconnect arbiter also comprises a means for determining a memory access request policy among a plurality of heterogeneous memory access request policies, each heterogeneous memory access request policy among the plurality of heterogeneous memory access request policies corresponding to a homogeneous memory within the heterogeneous memory system coupled to the bus interconnect. The bus interconnect arbiter also comprises a means for routing the memory access request to the homogeneous memory in the heterogeneous memory system coupled to the bus interconnect corresponding to the determined memory access request policy.

In another embodiment, a heterogeneous memory system coupled to the bus interconnect in a processor-based system is provided. The heterogeneous memory system comprises a memory controller configured to receive memory access requests in a bus interconnect, the memory controller having a first memory channel and a second memory channel. A first homogeneous memory is coupled to the first memory channel of the memory controller, wherein the first homogeneous memory is comprised of volatile memory. A second homogeneous memory is coupled to the second memory channel of the memory controller, wherein the second homogeneous memory is comprised of non-volatile memory in the bus interconnect. The memory controller is further configured to route the memory access requests to either the first homogenous memory or the second homogeneous memory.

In another embodiment, a heterogeneous memory system coupled to a bus interconnect in a processor-based system is provided. The heterogeneous memory system includes a memory controller. The memory controller comprises a means for receiving memory access requests in the bus interconnect, the memory controller having a first memory channel and a second memory channel. The memory controller also comprises a means for routing the memory access requests in the bus interconnect to either a first homogeneous memory coupled to the first memory channel of the memory controller, wherein the first homogeneous memory is comprised of volatile memory or a second homogeneous memory coupled to the second memory channel of the memory controller, wherein the second homogeneous memory is comprised of non-volatile memory.

In another embodiment, a processor-based system is provided. The processor-based system is comprised of a bus interconnect coupled to at least one requesting device. The bus interconnect comprises a bus interconnect arbiter configured to route received memory access requests from the at least one requesting device to heterogeneous memory systems. The processor-based system also comprises a first homogeneous memory system coupled to the bus interconnect, wherein the first homogeneous memory system is comprised of volatile memory. The processor-based system further comprises a second homogeneous memory system coupled to the bus interconnect, wherein the second homogeneous memory system is comprised of non-volatile memory. The bus interconnect arbiter is configured to receive the memory access requests in the bus interconnect from the at least one requesting device. The bus interconnect arbiter is also configured to determine a memory access request policy among a plurality of heterogeneous memory access request policies, each heterogeneous memory access request policy among the plurality of heterogeneous memory access request policies corresponding to either the first homogeneous memory system or the second homogeneous memory system coupled to the bus interconnect. The bus interconnect arbiter is further configured to route the memory access requests to a homogeneous memory among the first homogeneous memory system or the second homogeneous memory system coupled to the bus interconnect corresponding to the determined memory access request policy.

In another embodiment, a method of a bus interconnect arbiter for routing memory access requests to a heterogeneous memory system in a processor-based system is provided. The method comprises receiving a memory access request in a bus interconnect from a requesting device. The method also comprises determining a memory access request policy among a plurality of heterogeneous memory access request policies, each heterogeneous memory access request policy among the plurality of heterogeneous memory access request policies corresponding to a homogeneous memory within the heterogeneous memory system coupled to the bus interconnect. The method also comprises routing the memory access request to the homogeneous memory in the heterogeneous memory system coupled to the bus interconnect corresponding to the memory access request policy.

In another embodiment, a computer-readable medium having stored thereon computer-executable instructions to cause a bus interconnect arbiter for routing memory access requests to a heterogeneous memory system in a processor-based system to receive a memory access request in a bus interconnect from a requesting device is provided. The computer-executable instructions are configured to cause the bus interconnect arbiter to determine a memory access request policy among a plurality of heterogeneous memory access request policies, each heterogeneous memory access request policy among the plurality of heterogeneous memory access request policies corresponding to a homogeneous memory within the heterogeneous memory system coupled to the bus interconnect. The computer-executable instructions are further configured to cause the bus interconnect arbiter to route the memory access request to the homogeneous memory in the heterogeneous memory system coupled to the bus interconnect corresponding to the memory access request policy.

BRIEF DESCRIPTION OF THE FIGURES

FIG. 9B is a diagram of an exemplary memory access request (MAR) queue employed in a bus interconnect for routing memory access requests in a processor-based system that includes a heterogeneous memory system;

FIG. 14 is an exemplary memory access request (MAR) dynamic profile table for determining dynamic memory access request profile policies.

DETAILED DESCRIPTION

Figure 1:
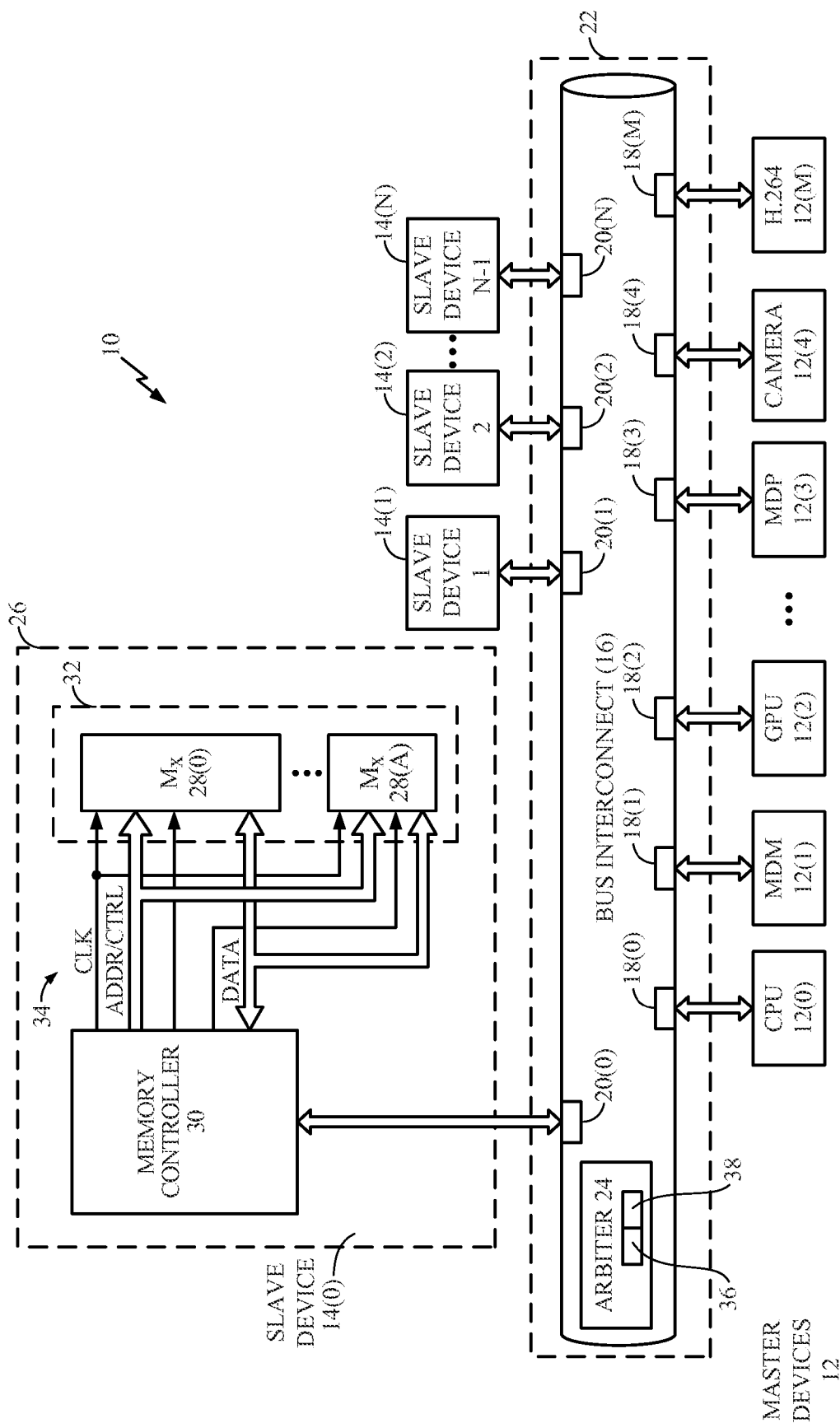
FIG. 1 is a block diagram of an exemplary processor-based system that includes a heterogeneous memory system capable of providing heterogeneous memory accesses for memory access requests from master devices sent over a bus interconnect.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include heterogeneous memory systems, and related methods and computer-readable media for supporting heterogeneous memory access requests in processor-based systems. A heterogeneous memory system is comprised of a plurality of homogeneous memories that can be accessed for a given memory access request. Each homogeneous memory has particular power and performance characteristics. For example, one homogeneous memory in the heterogeneous memory system may be volatile memory requiring power for refreshing, but having increased performance over non-volatile memory. As a further example, another homogeneous memory in the heterogeneous memory system may be non-volatile memory not requiring power for refreshing, but having reduced performance over non-volatile memory. In this regard, a memory access request can be advantageously routed to one of the homogeneous memories in the heterogeneous memory system based on the memory access request, and power and/or performance considerations. Heterogeneous memory access request policies may be predefined or determined dynamically based on key operational parameters, such as read/write type, frequency of page hits, and memory traffic, as non-limiting examples. In this manner, memory access request times can be optimized to be reduced without the need to make tradeoffs associated with having only one memory type available for storage.

In this regard, FIG. 1 illustrates an exemplary processor-based system 10. In this embodiment, the processor-based system 10 includes a plurality of master devices 12(0-M) and a plurality of slave devices 14(0-N) coupled to a bus interconnect 16. The bus interconnect 16 receives and routes memory access requests from one or more of the plurality of master devices 12(0-M) coupled to master ports 18(0-M) of the bus interconnect 16 to any of the plurality of slave devices 14(0-N) coupled via slave ports 20(0-N) to the bus interconnect 16. As a non-limiting example, the plurality of master devices 12(0-M), the plurality of slave devices 14(0-N), and the bus interconnect 16 may be provided in a semiconductor die 22 and may be provided in a system-on-a-chip (SOC) integrated circuit design, if desired.

With continuing reference to FIG. 1, a bus interconnect arbiter 24 may be provided internal or external to the bus interconnect 16. The bus interconnect arbiter 24 is provided in the bus interconnect 16 in this embodiment to arbitrate multiple communication requests from the master devices 12(0-M) to the slave devices 14(0-N). The master devices 12(0-M) and the slave devices 14(0-N) can be any type of electronic device or subsystem desired. As illustrated in FIG. 1, the master devices 12(0-M) may be any type of electronic device, including without limitation a central processing unit (CPU) 12(0), a mobile data modem (MDM) 12(1), a graphics processing unit (GPU) 12(2), a mini display port (MDP) 12(3), a camera 12(4), and an H.264 (high resolution video compression encoder) 12(M).

One example of the slave device 12(0) is a heterogeneous memory system 26, which is a memory system configured to store both data and instructions for operation of the processor-based system 10. The heterogeneous memory system 26 is comprised of a plurality of homogeneous memories 28(0-A) that can be accessed for a given memory access request by the master devices 12(0-M). A homogeneous memory is a particular memory type that has common power and/or performance characteristics. A heterogeneous memory system includes at least two different types of homogeneous memory. As will be discussed in more detail below, each homogeneous memory 28(0-A) in the heterogeneous memory system 26 in FIG. 1 has particular power and performance characteristics. For example, one homogeneous memory 28(0) in the heterogeneous memory system 26 may be volatile memory requiring power for refreshing, but having increased performance over non-volatile memory. As a further example, another homogeneous memory 28(A) in the heterogeneous memory system 26 may be non-volatile memory not requiring power for refreshing, but may have reduced performance over non-volatile memory. In this regard, a memory access request from the master devices 12(0-M) can be advantageously routed in the processor-based system 10 to one of the homogeneous memories 28(0-A) in the heterogeneous memory system 26 based on the memory access request, and power and/or performance considerations.

With continuing reference to FIG. 1, the bus interconnect arbiter 24 receives memory access requests from the master devices 12(0-M). The bus interconnect arbiter 24 directs the memory access requests to the heterogeneous memory system 26 containing a memory controller 30 coupled to a memory 32. The memory 32 further comprises the plurality of homogeneous memories 28(0-A). The memory 32 is coupled to the memory controller 30 via two buses (DATA and ADDR/CTRL) and a clock signal (CLK). The data bus (DATA) is used by the memory controller 30 to transfer data to and from the memory 32. The address and control bus (ADDR/CTRL) is used to select and control the memory 32, and the clock signal (CLK) is used to time both the data bus (DATA) and the address and control bus (ADDR/CTRL). The bus interconnect arbiter 24 directs the memory access requests based on a plurality of heterogeneous memory access request policies. As will be discussed below, these heterogeneous memory access request policies may be based on performance requirements, memory traffic patterns, page hit ratios, energy usage requirements, or other operationally related requirements.

With continuing reference to FIG. 1, the heterogeneous memory system 26 is connected to the bus interconnect 16 to allow any of the master devices 12(0-M) to provide read and write memory access requests to the memory 32 in the heterogeneous memory system 26 and to receive read and write responses. In this regard, the heterogeneous memory system 26 includes the memory controller 30 that interfaces the bus interconnect 16 with the memory 32. The memory controller 30 also controls the flow of data to and from the memory 32 in response to a memory access request provided by the master devices 12(0-M) through the bus interconnect 16 destined for the heterogeneous memory system 26. A memory bus 34 is provided to interface the memory 32 with the memory controller 30. Each of the plurality of homogeneous memories 28(0-A) may be a separate memory chip that is individually selected by the memory controller 30 for memory access requests. The homogeneous memories 28(0-A) may be further configured as a plurality of volatile homogeneous memories 28(0) and a plurality of non-volatile homogeneous memories 28(A). As discussed above, the memory 32 contains the plurality of homogeneous memories 28(0-A) that are of homogeneous memory types, such as but not limited to, volatile or non-volatile memory.

The bus interconnect arbiter 24 is configured to route received memory access request transactions from the master devices 12(0-M) to the heterogeneous memory system 26 based on a determined heterogeneous memory access request (MAR) policy (not shown). The purpose of the heterogeneous MAR policy is to enable selection of a homogeneous memory 28 from the plurality of homogeneous memory 28(0-A) in the heterogeneous memory system 24. The decision of which homogeneous memory 28 to select for a memory access request is based on the heterogeneous MAR policy. The heterogeneous MAR policy can include the necessary information or criteria for selecting a homogeneous memory 28 . . . .

Also, by providing a heterogeneous memory system 24 that would otherwise be a homogeneous memory system, the processor-based system 10 design can take advantage of the unique power and performance characteristics of each unique homogeneous memory 28 within the heterogeneous memory system 24 without be limiting to a single, homogeneous memory. Further, because the homogeneous memories 28 within the heterogeneous memory system 24 are coupled to the same bus interconnect 16 in this embodiment, the heterogeneous memory system 24 can be transparent to the master devices 12(0-M) providing memory access requests. In other words, the requesting devices 12(0-M) can provide memory access requests that do not require prior knowledge or special settings for memory requests. This can have an additional advantage of not requiring an architecture change in the processor-based system 20 employing the heterogeneous memory system 28 or the requesting devices 12(0-M) over providing only homogeneous memory coupled to the bus interconnect 16 of the processor-based system 10.

While the bus interconnect arbiter 24 determines the heterogeneous MAR policy, the memory controller 30 is configured to implement the determined policy in this embodiment. In this embodiment, the heterogeneous MAR policy may be based on either a static or dynamic heterogeneous MAR policy. A static heterogeneous MAR policy is a predefined MAR policy that is not based on current dynamic or run-time operational parameters. As discussed in more detail below, the bus interconnect arbiter 24 in FIG. 1 is configured with a heterogeneous MAR policy table 36 to store default and static heterogeneous memory access request policies to use in determining which of the plurality of homogeneous memories 28(0-A) in the heterogeneous memory system 26 to route memory access requests based on the type of requesting device or master device 12(0-M). A dynamic heterogeneous MAR policy is based on system operational characteristics, such as but not limited to, application priorities, page hit ratios, power priorities, read/write priorities, memory traffic requirements, etc. As will be discussed below, a master device 12(0-M) and the bus interconnect arbiter 24 could be configured to determine and provide a dynamic heterogeneous MAR policy. As illustrated in FIG. 1, the bus interconnect arbiter 24 is also configured with a MAR dynamic profile table 38 that stores valid heterogeneous memory access request profiles for the master devices 12(0-M) to be used in determining dynamic heterogeneous memory access request policies.

Figure 2:
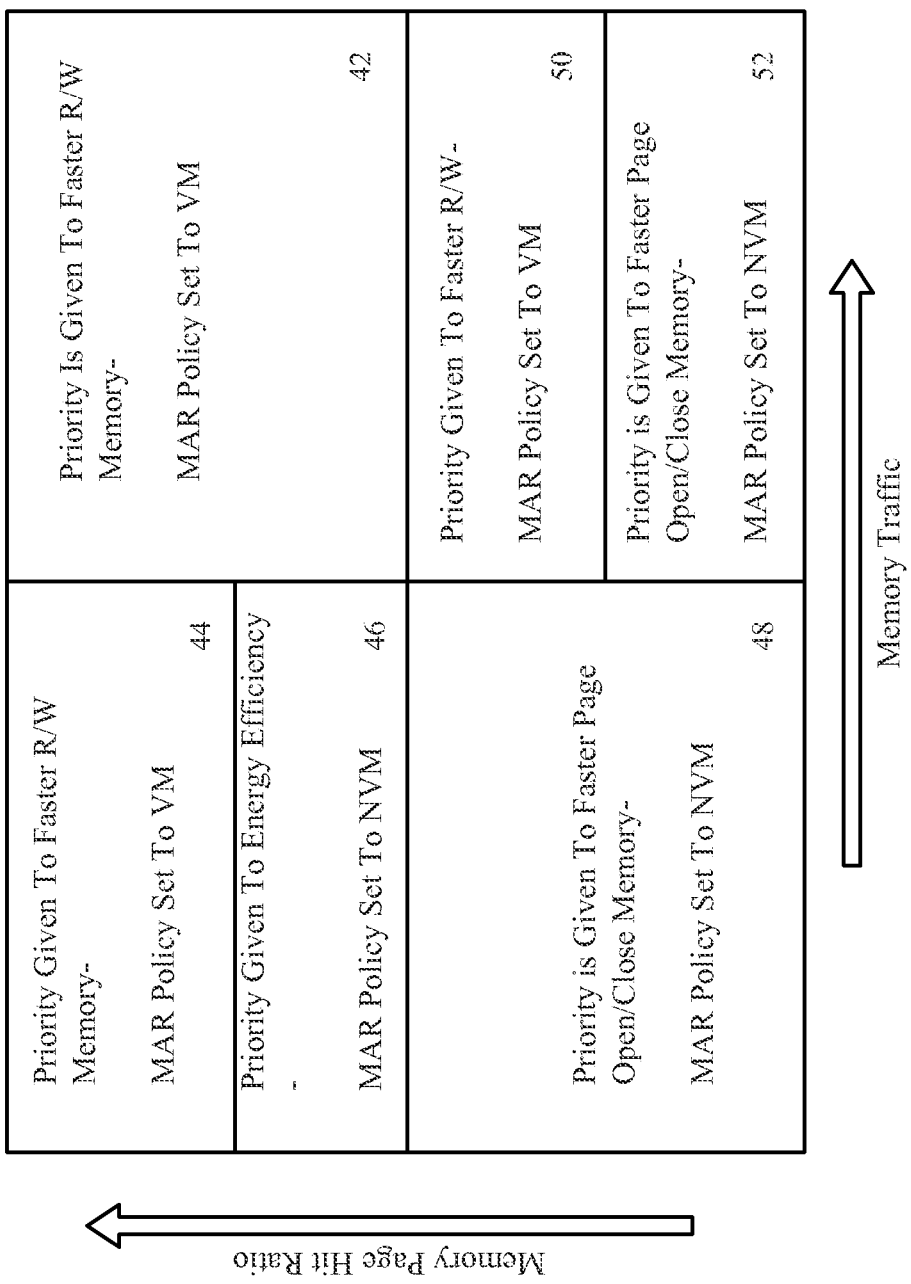
FIG. 2 is an exemplary heterogeneous memory access request (MAR) policy chart illustrating exemplary memory access request policies to determine which memory to utilize in a heterogeneous memory system for a memory access request.

The characteristics of a memory access request, as well as other operational parameters in a processor-based system, can be used to determine to which homogenous memory a memory access request should be advantageously routed. In this regard, FIG. 2 illustrates exemplary heterogeneous MAR policies 40 used to determine which of the plurality of homogeneous memories 28(0-A) (shown in FIG. 1) is used for a memory access request transaction. As an example, sequential memory accesses may have higher memory page hit ratios. In higher memory traffic situations, it may be advantageous to employ a heterogeneous memory access request policy (as shown in block 42 of FIG. 2) that accesses volatile memory having memory performance characteristics of higher read/write speeds, larger page size, and slower open/close speeds. In lower memory traffic situations, it may be advantageous to access either volatile or non-volatile memory based on priority given to performance. If priority is given to performance, it may be advantageous to employ a heterogeneous memory access request policy (block 44) to access volatile memory for its performance benefits over volatile memory. If priority is not given to performance, it may be advantageous to employ a heterogeneous memory access request policy (block 46) to access non-volatile memory for its power consumption benefits over volatile memory.

With continuing reference to FIG. 2, as another example, random memory accesses may have lower memory page hit ratios. In lower memory traffic situations, it may be advantageous to employ a heterogeneous memory access request policy (block 48) that accesses non-volatile memory having characteristics of lower read/write speeds and faster open/close speeds to benefit from lower power consumption since higher performance characteristics may not be required. In higher memory traffic situations, it may be advantageous to access either non-volatile or volatile memory based on priority given to power consumption efficiency. If priority is given to performance over power consumption efficiency, it may be advantageous to employ a heterogeneous memory access request policy (block 50) to access volatile memory for its performance benefits over volatile memory. If priority is given to power consumption efficiency, it may be advantageous to employ a heterogeneous memory access request policy (block 52) to access non-volatile memory for its power consumption benefits over volatile memory.

Figure 3:
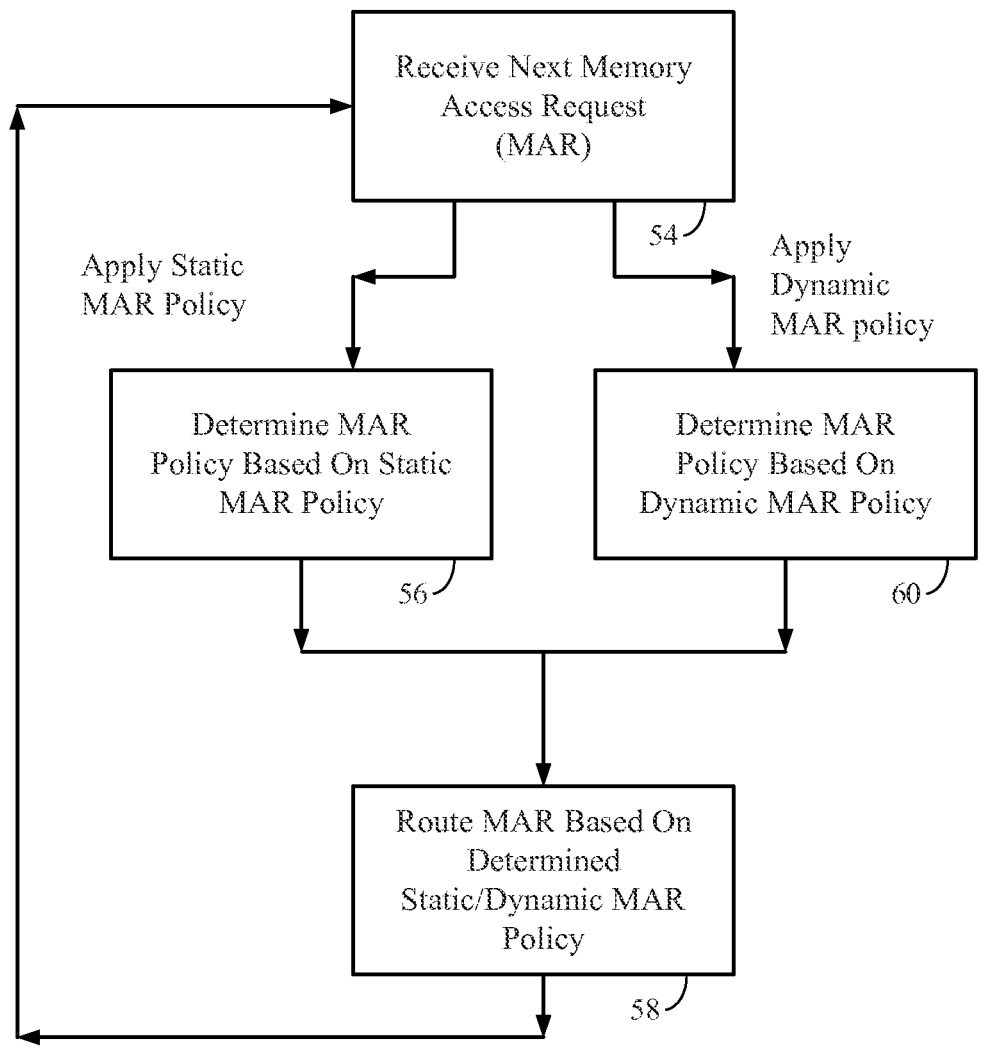
FIG. 3 is a flowchart illustrating exemplary processing of memory access requests for a heterogeneous memory system in a processor-based system, including but not limited to the processor-based system of FIG. 1.

FIG. 3 is a flowchart illustrating an exemplary process that can be performed by the bus interconnect arbiter 24 in the processor-based system 10 of FIG. 1 to evaluate and process a memory access request transaction based on a heterogeneous MAR policies 40 (shown in FIG. 2). In this process, the bus interconnect arbiter 24 receives a next memory access request (block 54). The memory access request is determined to be either a static memory access requestor a dynamic memory access request in this embodiment. If the memory access request is a static memory access request, a static MAR policy is determined for a memory access request (block 56). Thereafter, the memory access request will be routed to a homogeneous memory 28 (not shown) within the heterogeneous memory system 26 based on a determined static MAR policy (block 58). If the memory access request is a dynamic memory access request, a dynamic MAR policy is determined for the dynamic memory access request (block 60). Thereafter, the memory access request will be routed to a particular homogeneous memory 28 (not shown) within the heterogeneous memory system 26 based on the determined dynamic MAR policy (block 58).

Figure 4:
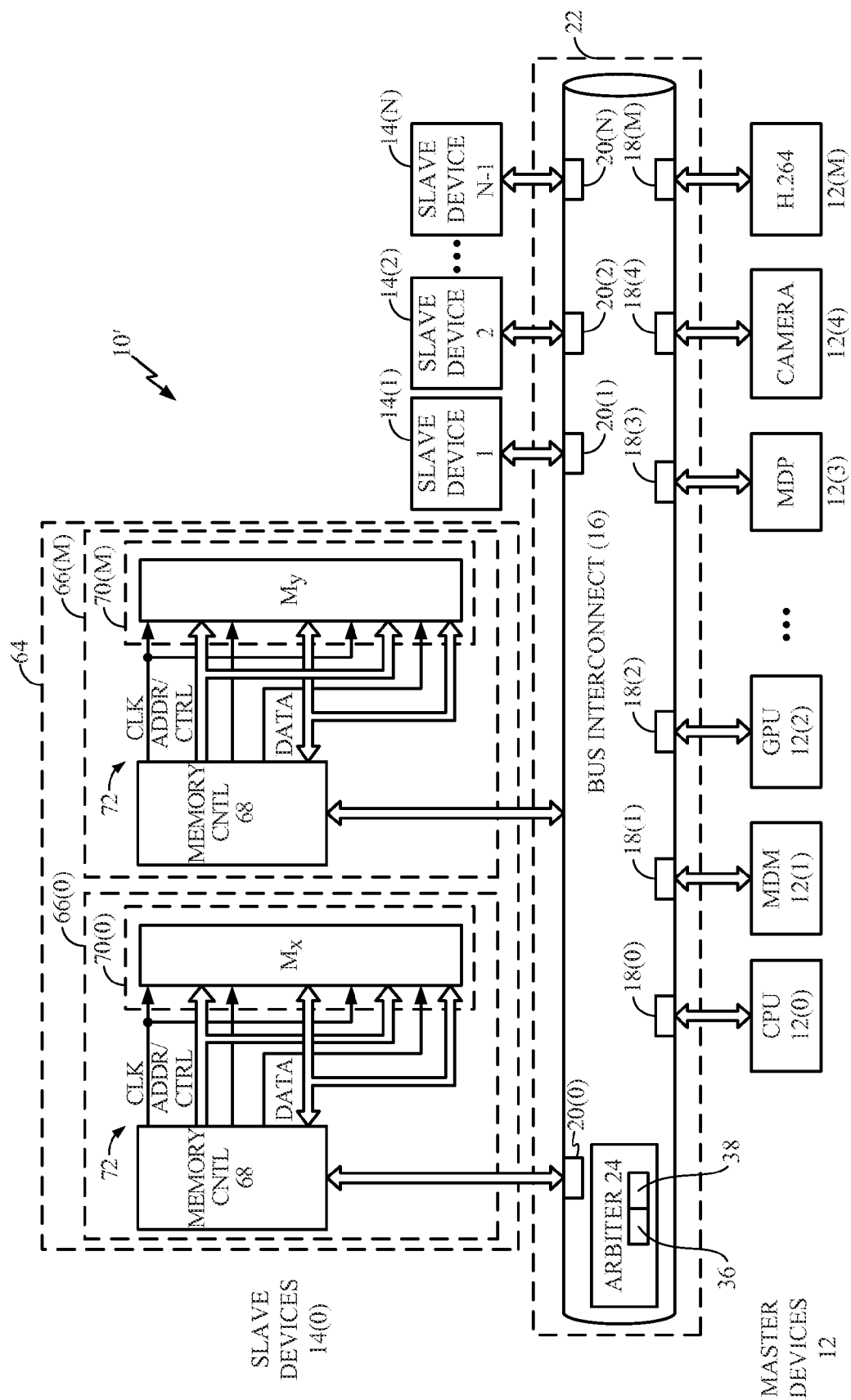
FIG. 4 is a block diagram of another exemplary processor-based system that includes a heterogeneous memory system employing multiple memory controllers, each controlling access to a homogeneous memory in the heterogeneous memory system for memory access requests.

In addition to the heterogeneous memory system 26 in FIG. 1, other configurations of heterogeneous memory systems are possible. For example, FIG. 4 illustrates another processor-based system 10' that is similar to the processor-based system 10 in FIG. 1, but includes an alternative heterogeneous memory system 64 to the heterogeneous memory system 26 in FIG. 1. Common components between FIG. 1 and FIG. 4 use the same element numbers and will not be redescribed. In the heterogeneous memory system 64 in FIG. 4, multiple homogeneous memory systems 66(0-M) are provided, each having a dedicated memory controller 68. Each memory controller 68 in the homogeneous memory systems 66(0-M) is configured to control respective homogeneous memory systems 70(0-M), unlike the heterogeneous memory system 26 in FIG. 1. Thus, the memory controllers 68 in FIG. 4 do not decide the heterogeneous MAR policy to be applied to memory access requests. In this embodiment, the bus interconnect arbiter 24 determines the heterogeneous MAR policy to be applied for memory access requests. The bus interconnect arbiter 24 implements the determined heterogeneous MAR policy by routing the memory access requests to a particular desired slave port 20(0) representing the proper one of the homogeneous memory systems 66(0-M). Once the memory access request is received by the proper one of the homogeneous memory systems 66(0-M), the memory access request is simply routed by the memory controller 68 in the homogeneous memory systems 66(0-M) to the homogenous memory 70(0-M) coupled to the dedicated memory controller 68 based on a memory address in the memory access request.

Figure 5:
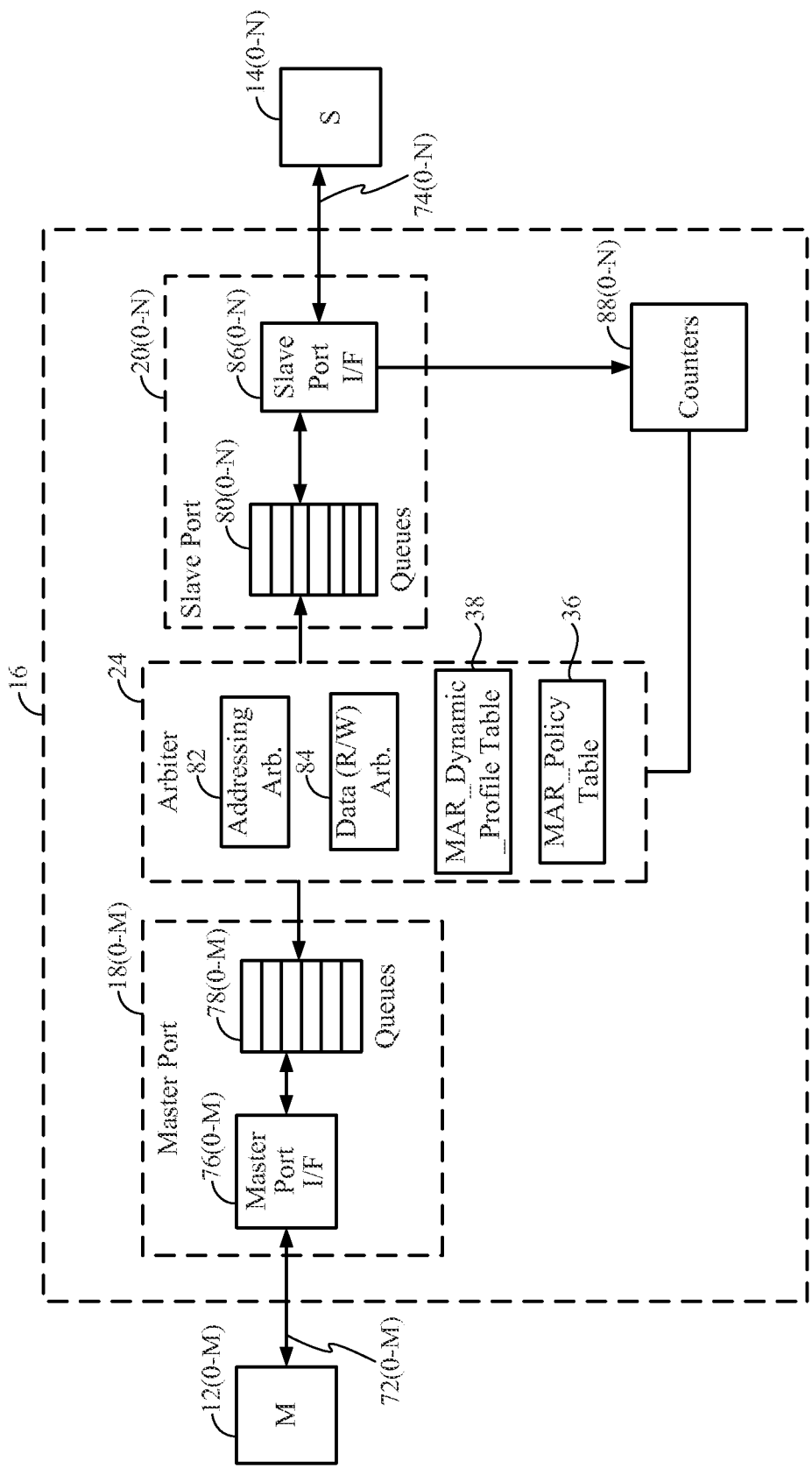
FIG. 5 is a block diagram of exemplary circuitry including a bus interconnect arbiter involved in communicating and processing memory access requests from a plurality of requesting devices to a heterogeneous memory system.

FIG. 5 illustrates a more detailed example of the bus interconnect 16 of FIG. 1 and illustrates exemplary routing resources for routing bus transactions from master devices to slave devices, including memory access requests. The bus interconnect arbiter 24 arbitrates bus transactions between the master devices 12(0-M) and the slave devices 14(0-N) coupled to the bus interconnect 16. The bus interconnect arbiter 24 in FIG. 1 will determine the heterogeneous MAR policy 40 and route the memory access request to one of the slave ports 20(0-N). The memory controller 30 of FIG. 1, coupled to the slave port 20(0-N), determines the homogeneous memory 28(0-A) that should receive the routed memory access request. In the alternative heterogeneous processor-based system 10' of FIG. 4, the bus interconnect arbiter 24 will determine the heterogeneous MAR policy 40 and select the slave port 20(0-N) to which the memory access request is routed based on the determined heterogeneous MAR policy 40. The difference in this alternative heterogeneous processor-based system 10' is that the bus interconnect arbiter 24 will route the memory access request to the determined slave port 20(0-N) and the memory controller 68 will further route to the homogeneous memory system 70(0-M). As illustrated in FIG. 1 and FIG. 4, communications are supported between the master devices 12(0-M) and the bus interconnect 16 through master port buses 72(0-M) coupled to the master ports 18(0-M). Similarly, communications are supported between the slave devices 14(0-N) and the bus interconnect 16 through slave port buses 74(0-N) coupled to the slave ports 20(0-N). The bus interconnect 16 includes clocked circuitry such as gates, latches, and registers as examples, that are configurable to set up a communication path between the desired master device 12(0-M) and the desired slave device 14(0-N). For example, as illustrated in FIG. 4, exemplary components provided in the bus interconnect 16 are configurable to provide a communication path between one of the master devices 12(0-M) and one of the slave devices 14(0-N).

With continuing reference to FIG. 5, the master ports 18(0-M) each include master port interfaces 76(0-M) connected to the master port buses 72(0-M) to receive bus transactions from the master devices 12(0-M). Master port queues 78(0-M) are provided to store bus transactions or commands that are provided to the bus interconnect arbiter 24 to arbitrate bus transactions between the master port queues 78(0-M) and slave port queues 80(0-N). The bus interconnect arbiter 24 may include a separate addressing arbiter 82 associated with the slave ports 20(0-N) to arbitrate bus transactions to the slave devices 14(0-N), and a data (read/write) arbiter 84 associated with the master ports 18(0-M) to arbitrate read data and write completion responses coming from the slave ports 20(0-N). The slave port queues 80(0-N) provide bus transactions to slave port interfaces 86(0-N) connected to the slave port buses 74(0-N). Note that although FIG. 5 illustrates a communication path between one of the master ports 18(0-M) coupled to one of the master devices 12(0-M), and one of the slave ports 20(0-N) coupled to one of the slave devices 14(0-N), the addressing arbiter 82 and the data (read/write) arbiter 84 can be configured to arbitrate communication paths made possible by the bus interconnect 16 between the master ports 18(0-M) and the slave ports 20(0-N).

With continuing reference to FIG. 5, counters 88(0-N) may also be provided for each slave port 20(0-N). The counters 88(0-N) count transactions completed by the slave port interfaces 86(0-N), respectively. The counters 88(0-N) can provide count and system operational information to the bus interconnect arbiter 24, so that the bus interconnect arbiter 24 can input valid dynamic profile information into the MAR dynamic profile table 38. The bus interconnect arbiter 24 is further configured to make policy determinations based on valid memory access request (MAR) dynamic profile information in the MAR dynamic profile table 38. For example, the bus interconnect arbiter 24 can use the counters 88(0-N) to evaluate if completion of the memory access request transaction is ahead of schedule, on-schedule, or behind a deadline, and apply a bus arbitration policy for memory access request transactions in response. FIGS. 6-15 illustrate more specifics and detail regarding exemplary processes of heterogeneous memory systems, and related methods and computer-readable media for supporting heterogeneous memory access requests in processor-based systems.

When powered up or re-energized, a processor-based system must be prepared to begin normal operations. In the case of the processor-based system 10 of FIG. 1, it is necessary to establish an initial and default heterogeneous memory access request policy. Whether the processor-based system 10 is in a static or a dynamic mode of operation, an initial set of heterogeneous memory access request policies must be established. In the specific situation of the dynamic mode of operation, there may not have been enough time to gather sufficient information to define an operating profile. In such a case, a default heterogeneous memory access request policy will be necessary.

Figure 6:
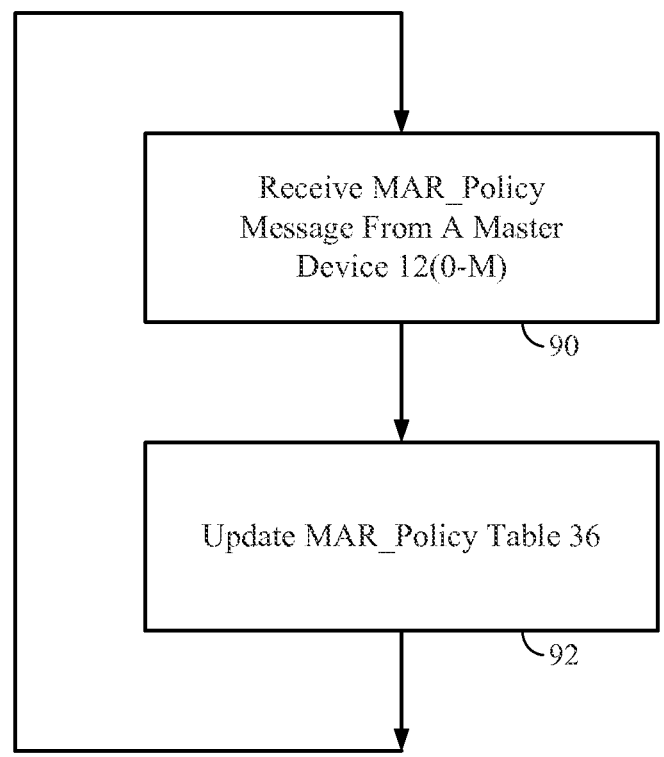
FIG. 6 is a flowchart of an exemplary process for processing a memory access request policy initialization for memory access requests received from a master device in a processor-based system that includes a heterogeneous memory system.

In this regard, FIG. 6 is a flowchart illustrating an exemplary update to a heterogeneous MAR policy table 36 used to determine the default memory access request policy. The master device 12(0-M) and application policy table update is performed here by the bus interconnect arbiter 24. In the alternative, this update may be performed directly by the updating master device 12(0-M). Upon updating by the master device 12(0-M), application initialization, or a subsequent policy update, the bus interconnect arbiter 24 will receive a MAR policy message (block 90), as discussed in more detail below in FIG. 8B. The MAR policy message contains the necessary default homogeneous memory information for storage in the heterogeneous MAR policy table 36, as discussed below in FIG. 8C. Once the MAR policy message is received, the bus interconnect arbiter 24 will update the heterogeneous MAR policy table 36 (block 92).

The memory access request information allows the bus interconnect arbiter 24 to determine the heterogeneous MAR policy for the memory access request and to direct the memory access request to the appropriate one of the slave devices 14(0-N). The memory access request information includes detail that is provided to the bus interconnect arbiter 24 to evaluate based on a heterogeneous MAR policy 40. In this regard, FIGS. 7 and 8A-C describe an exemplary process and supporting tables and message blocks that may be used to communicate between the master devices 12(0-M) and the bus interconnect arbiter 24 to initialize, update, or apply operation mode or current heterogeneous memory access request policy.

Figure 7:
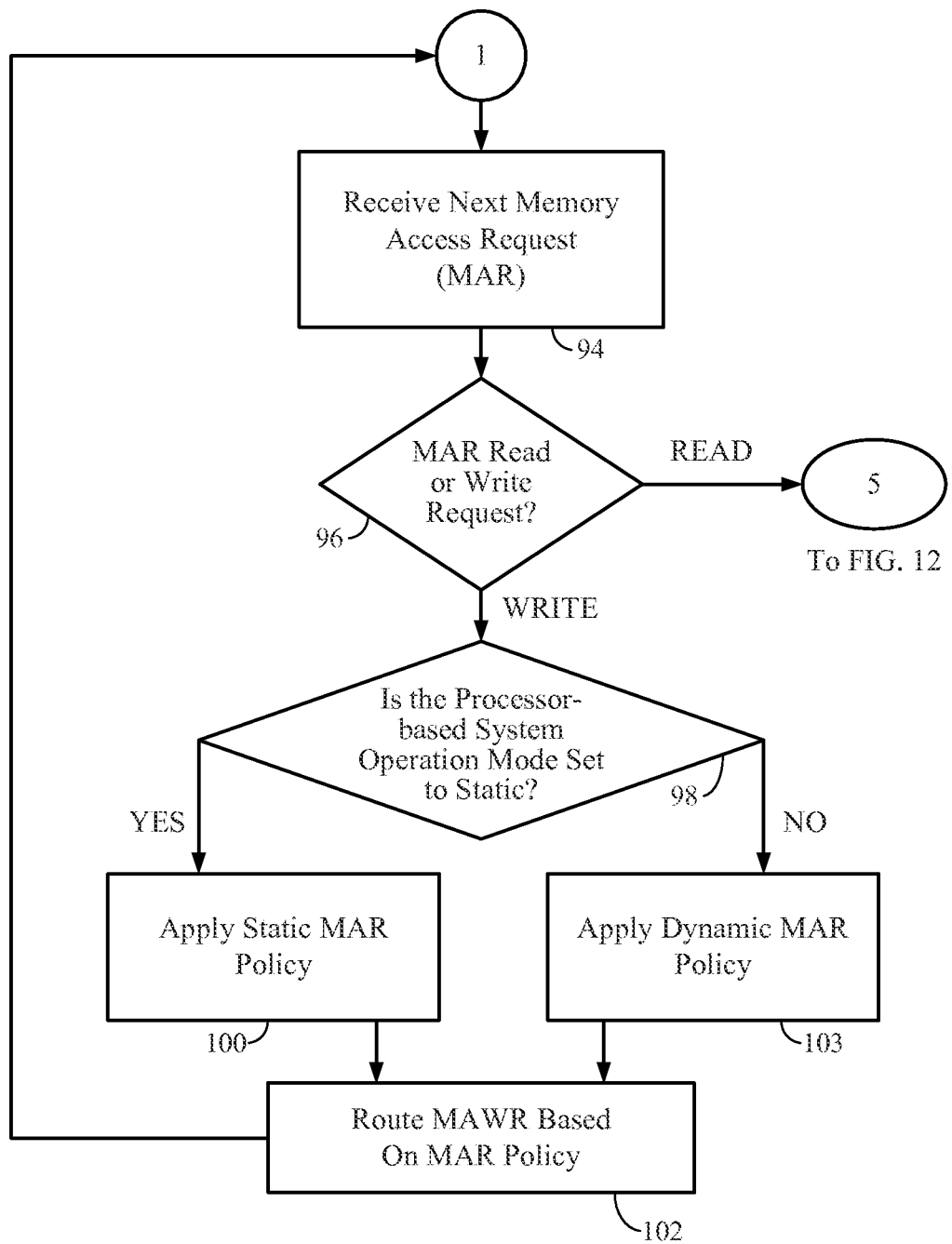
FIG. 7 is a flowchart of a more detailed exemplary process for processing memory access requests for a heterogeneous memory system in a processor-based system, including but not limited to the processor-based systems of FIGS. 1 and 4.

In this regard, FIG. 7 is a flowchart illustrating an exemplary process wherein the bus interconnect arbiter 24 receives, determines, and applies the memory access request policy, then routes the memory access request based on the heterogeneous memory access request policy. The memory access request is received and then proceeds to process the received memory access request (block 94). After receiving the memory access request, the bus interconnect arbiter 24 determines whether the memory access request is a read or a write request (block 96). If the bus interconnect arbiter 24 determines that the memory access request is a write transaction, the bus interconnect arbiter 24 will determine this to be a memory access write request (MAWR). The heterogeneous MAR policy determination will be based on the operation mode indicator table 104 in FIG. 8A. An operation mode indicator setting 106 is used to determine whether the bus interconnect arbiter 24 is to apply a static or dynamic MAR policy to a memory access request (block 98).

In further reference to FIG. 7, if the bus interconnect arbiter 24 determines that the processor-based system is in a static operation mode (block 98), a static MAR policy will be applied (block 100). The memory access request will be routed based on a determined MAR policy (block 102). However, if it is determined that a dynamic MAR policy will be applied (block 103), the memory access request will be alternately routed based on this determined MAR policy (block 102). If, on the other hand, the bus interconnect arbiter 24 determines that the memory access request is a read transaction type, the bus interconnect arbiter 24 will proceed to FIG. 12, as described below. The heterogeneous memory access request policy applied in FIG. 7 is initialized and updated using a heterogeneous MAR policy message block 108 of FIG. 8B and stored in the heterogeneous MAR policy table 36 of FIG. 8C.

Figures 8A, 8B, 8C:
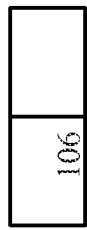
FIG. 8A is an exemplary status indicator for indicating an operational memory access request mode.
FIG. 8B is an exemplary heterogeneous memory access request (MAR) policy message block utilized by master devices to provide memory access request policy initializations.
FIG. 8C is an exemplary heterogeneous memory access request (MAR) policy table for storing memory access request policies.

In this regard, FIG. 8B is an exemplary heterogeneous MAR policy message block 108. The heterogeneous MAR policy message block 108 contains blocks of information to update the heterogeneous MAR policy table 36 of FIG. 8C. A master_ID 110 contains information identifying the requesting master device 12(0-M). An application_ID 112 may further identify an application should there be a need to identify the requesting application in greater detail. The master_ID 110 and the application_ID 112 have a desired memory type 114. As an example, the memory type 114 may include, but is not limited to, information identifying the volatile memory or non-volatile memory which is to be used for the memory access request transaction. The heterogeneous MAR policy message block 108 is further configured with a power_off_reset 116 field, which indicates to the system whether the memory type 114 should be reset when power is cycled, or whether this state configuration should survive a power cycling of the processor-based system. FIG. 8C is a heterogeneous MAR policy table 36 containing the fields as described in the heterogeneous MAR policy message block 108 above in FIG. 8B. The heterogeneous MAR policy table 36 is updated as required by the bus interconnect arbiter 24 or the master devices 12(0-M) based on the heterogeneous MAR policy message block 108.

Figure 9A:
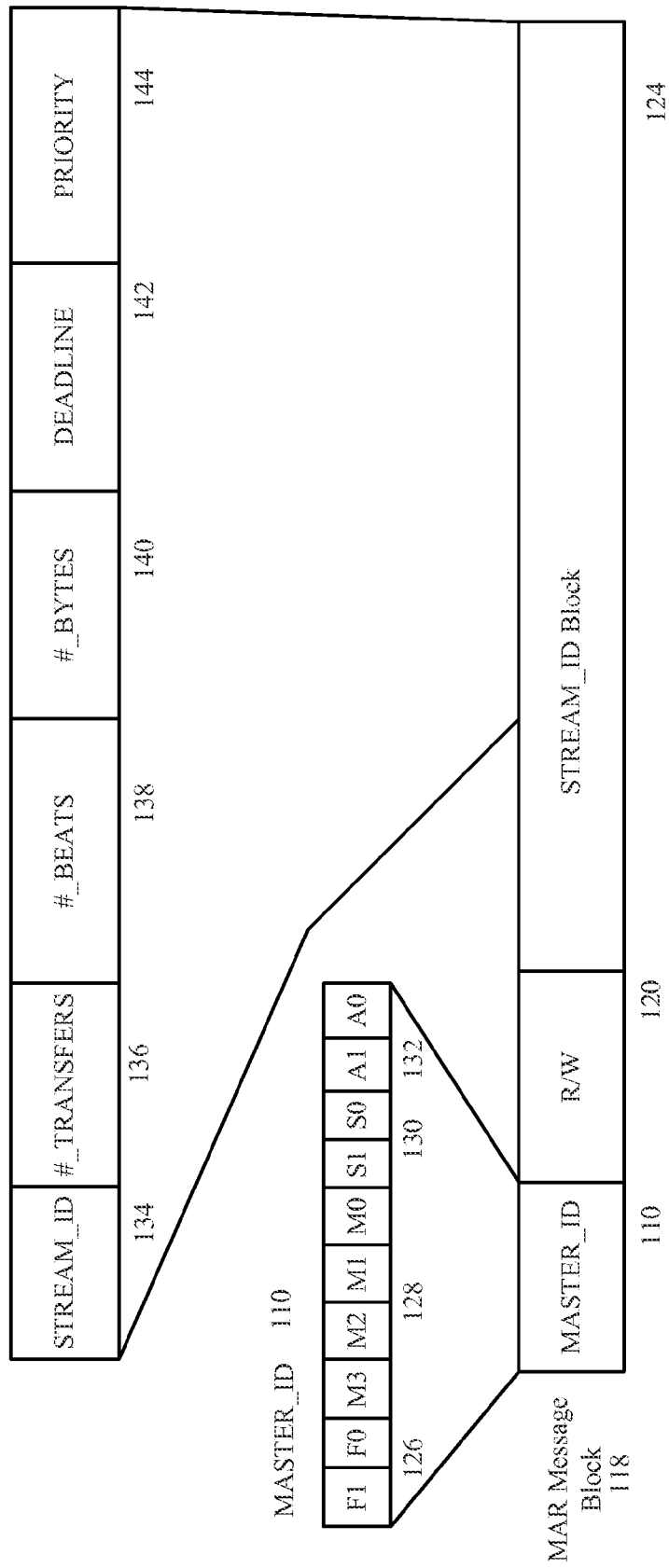
FIG. 9A is a diagram of exemplary memory access request (MAR) message blocks provided by a master device to a bus interconnect in a processor-based system that includes a heterogeneous memory system.

The structure of the MAR policy message blocks includes the necessary elements to determine the type of transaction (i.e., whether the transaction is a read/write transaction), which master device 12(0-M) is making the request, and even such information as deadlines and priorities. The memory access requests are defined by a MAR message block. The heterogeneous MAR policies are further applied to the memory access requests. In this regard, FIG. 9A illustrates a MAR message block 118 that comprises the master_ID 110 of FIG. 8B, a read/write indicator 120, and a stream_ID block 124. The MAR message block 118 contains message information that allows the bus interconnect arbiter 24 to perform memory access request transactions from the master devices 12(0-M). For example, the MAR message block 118 includes the master_ID 110 that contains information identifying the requesting master device 12(0-M). The bus interconnect arbiter 24 uses the master_ID 110 to determine which master device 12(0-M) is to receive responses from the slave devices 14(0-N). The master_ID 110 will also be used to determine the default heterogeneous MAR 40 based on the heterogeneous MAR policy table 36. If the bus transaction is a memory access request, the read/write indicator (R/W) 120 will be used to determine whether the memory access request is a read transaction or a write transaction. The stream_ID block 124 will provide stream transaction information for a bus transaction.

FIG. 9A contains a block diagram of an exemplary master_ID 110 that can be provided by a master device 12(0-M) in a memory access request sent to the bus interconnect arbiter 24. In this example, the master_ID 110 is a 10-bit word used to identify the master device 12(0-M) and may further define an application within the master device 12(0-M) when communicating with the bus interconnect arbiter 24. The upper two bits (F1, F0) contain a fabric identifier 126 that allows for identification of four distinct fabrics involved in a particular memory access request. The middle four bits (M3, M2, M1, M0) comprise a master device identifier 128 that identifies the master device 12(0-M). Thus, sixteen unique master devices 12(0-M) are possible in this example. The next two bits (S1, S0) contain a sub-master device identifier 130 that identifies the sub-master device identifier 130 coupled to the master device 12(0-M) that is provided or applicable. Thus, four unique sub-master devices are possible in this example. The lower two bits (A1, A0) contain an application identifier 132 that can be used to allow the master device 12(0-M) and/or a sub-master device to provide any application information desired. For example, the identification of a software process or thread could be provided in the application identifier 132 to allow the master device 12(0-M) and/or a sub-master device to identify the software process or thread responsible for a memory access request. Any other information desired could be included in the application identifier 132.

In further reference to FIG. 9A, a block diagram of an exemplary stream_ID block 124 is shown, which may be used as the stream_ID block 124 in the MAR message block 118. The stream_ID block 124 contains exemplary information related to a stream transaction provided to the bus interconnect arbiter 24 in FIGS. 1 and 4. The stream_ID block 124 allows the bus interconnect arbiter 24 to evaluate the heterogeneous MAR policy 40 to arbitrate stream transactions based on information related to the stream transactions. The master devices 12(0-M) provide the information in the stream_ID block 124 when requesting a stream transaction through the bus interconnect arbiter 24.

In FIG. 9A, the stream_ID block 124 includes a stream identifier field (STREAM_ID) 134 that identifies the stream transaction. A number of transfers field (#_TRANSFERS) 136 provides the number of burst transfers associated with a stream transaction. A number of beats field (#_BEATS) 138 provides the number of beats of data transfer to be performed for each burst transfer. A number of bytes field (#_BYTES) 140 provides the number of bytes of data to be performed for each beat transfer. The number of bytes field (#_BYTES) 140 may be configurable or a fixed value depending on the architecture of the bus interconnect arbiter 24 and the slave devices 14(0-N).

If there is a deadline associated with a stream transaction, deadline information can be stored in a deadline field (DEADLINE) 142. For example, a master device 12(0-M) may request that a particular stream transaction be completed within a certain timing, which could be in terms of clock cycles, beats, or other relative or absolute timing. A priority field (PRIORITY) 144 is also provided to allow a priority to be associated with a stream transaction. The priority field (PRIORITY) 144 may be configured to be supplied and/or altered by the master devices 12(0-M), the bus interconnect arbiter 24, or the slave devices 14(0-N) depending on design. This stream information may be used by the bus interconnect arbiter 24 to evaluate and apply a bus arbitration policy for a stream transaction to arbitrate the stream transaction.

The bus interconnect arbiter 24 in FIG. 1 receives MAR transactions from the master devices 12(0-M) that include the MAR message block 118 in FIG. 9A. As previously discussed, the bus transaction responses from the slave devices 14(0-N) in response to memory access requests, including stream transaction requests, are placed in the slave port queues 80(0-N). The bus interconnect arbiter 24 can evaluate a heterogeneous MAR policy for MAR responses based on the stream transaction information for the stream transactions stored in the slave port queues 80(0-N). In this regard, FIG. 9B is a diagram of the slave port queues 80(0-N) (not shown) accessed by the bus interconnect arbiter 24 to support evaluating and applying a heterogeneous MAR policy for arbitrating MAR transactions based on the MAR message block 118 in FIG. 9A. The slave port queues 80(0-N) may be provided in internal registers or other memory accessible by the bus interconnect arbiter 24 and may be internal or external to the bus interconnect 16. The MAR message block 118 is stored in queues.

In this regard and as illustrated in FIG. 9B, the slave port queue 80(0-N), also referred to herein as a memory access request (MAR) queue, is comprised of a table configured to hold zero to "X" number of MAR Queues 146. A queue number field (QUEUE #) 148 is used to index the MAR transaction responses stored in the slave port queues 80(0-N). Each MAR transaction response in the slave port queues 80(0-N) in this example includes the master_ID 110 to identify the master devices 12(0-M) to receive the MAR transaction response. The MAR transaction will also provide a memory address 149 for a read or write transaction reference in memory. If the MAR transaction request involves requesting data, the response data can be stored in a data field (DATA) 150. The stream_ID block 124 is also provided for each memory access request entry to store stream transaction information if the bus transaction request was a stream transaction.

A number of transfers remaining field (#_TRANS_REMAIN) 152 is also provided to allow the bus interconnect arbiter 24 to determine the progress of a stream transaction to use for evaluating and applying heterogeneous MAR policies 40 for the MAR transaction responses. The number of transfers remaining is set by the bus interconnect arbiter 24 based on the number of transfers field (#_TRANS_REMAIN) 152 which is provided for the stream transaction request in the number of transfers field (#_TRANS_REMAIN) 152 in the stream_ID block 124 in FIG. 9A. The counters 88(0-N) illustrated in FIG. 5 count the number of completed transfers from the slave devices 14(0-N) for pending MAR transactions to reduce the number of transfers remaining field (#_TRANS_REMAIN) 152. A rank field (RANK) 154 and a weight field (WEIGHT) 156 are also provided to allow a rank and/or weight to be used in a bus arbitration policy employed by the bus interconnect arbiter 24 to arbitrate between competing MAR transaction responses. As a non-limiting example, the weight field (WEIGHT) 156 could be used in a scheme of weighting the more important heterogeneous MAR policies 40. As another non-limiting example, the rank field (RANK) 154 could be employed to fix a priority to a heterogeneous MAR policy 40. Other heterogeneous MAR arbitration polices can be employed.

Figure 10:
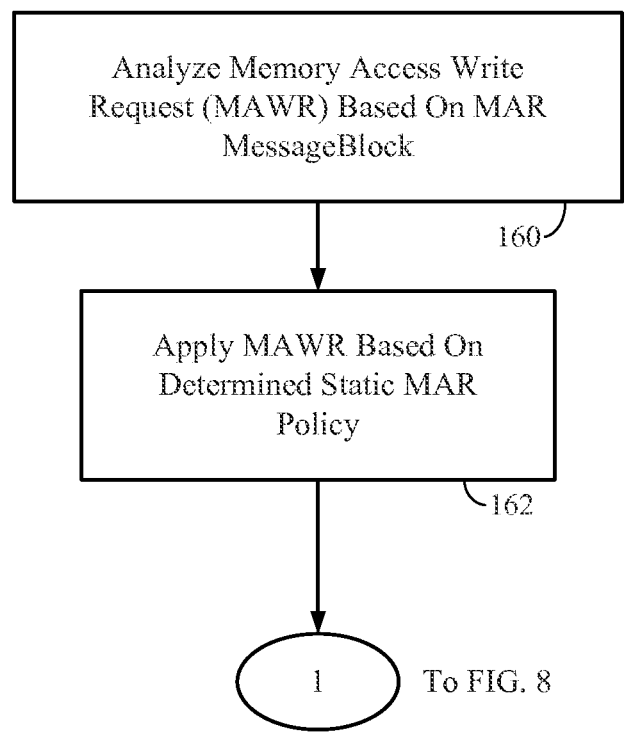
FIG. 10 is a flowchart of an exemplary process for processing a static memory access request policy for a memory access write request in a heterogeneous memory system.

The MAR message block 118 in the MAR Queues 146, as shown in FIG. 9B, contains the block information necessary to determine the heterogeneous MAR policy 40 based on the operation mode indicator setting 106 in FIG. 8A. The operation mode indicator table 104 of FIG. 8A indicates whether the bus interconnect arbiter 24 should process memory access requests in a static or a dynamic mode. In this regard, FIG. 10 is a flowchart of an exemplary process wherein the operation mode indicator setting 106 has indicated that the bus interconnect arbiter 24 should process each memory access request in the static mode. The exemplary process in FIG. 10 is a more detailed process of applying the static MAR policy (block 100) in FIG. 7. The memory access request is a heterogeneous memory access write request based on the static mode. In the static mode, the bus interconnect arbiter 24 may utilize the default heterogeneous MAR policy table 36 to determine which homogeneous memory 28 (in FIG. 1) and 70 (in FIG. 4) to direct the write request to. The bus interconnect arbiter 24 will analyze the MAR message block 118, parsing out the master_ID 110, the read/write indicator 120 and the stream_ID block 124 of FIG. 9A (block 160). The bus interconnect arbiter 24 next applies the heterogeneous MAR policy based on the heterogeneous MAR policy table 36 to the MAR write transaction (block 162). The bus interconnect arbiter 24 then returns to retrieve the next memory access request.

Figure 11A:
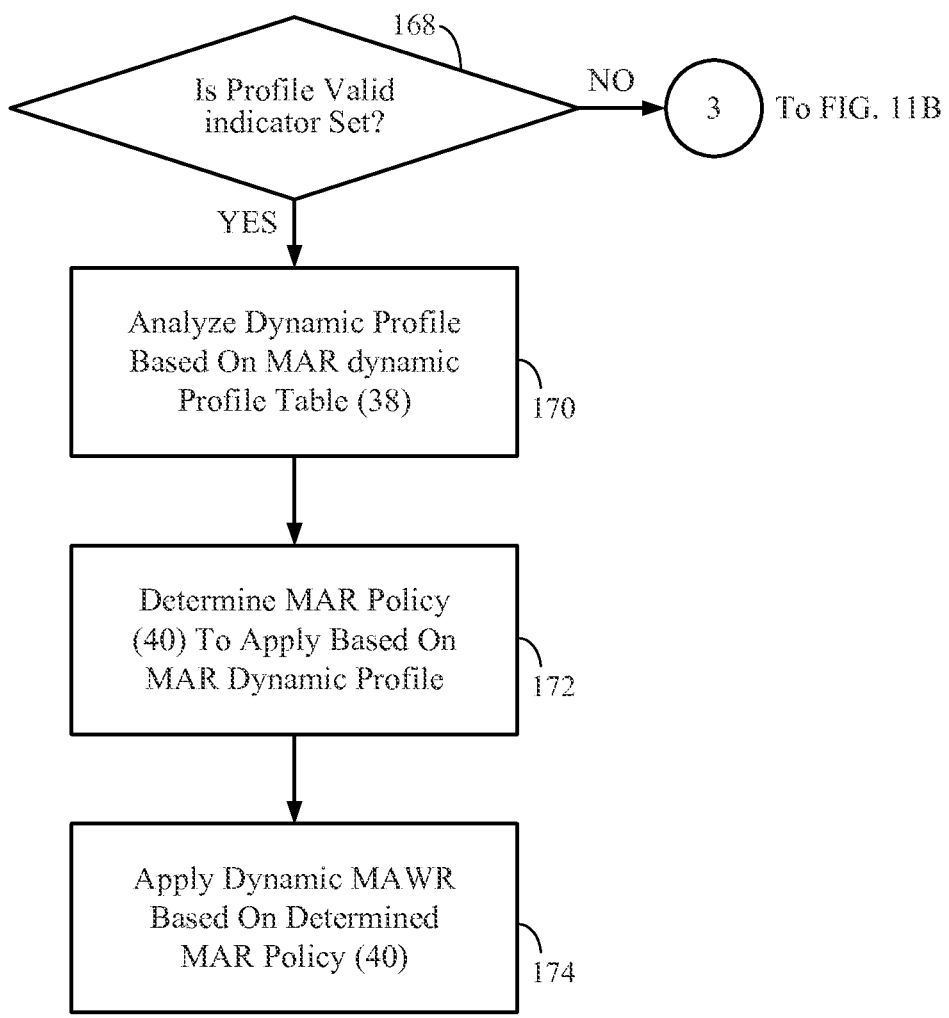
FIG. 11A is a flowchart of an exemplary process for processing a dynamic memory access write request policy for a memory access request in a heterogeneous memory system.

FIG. 11A is a flowchart illustrating the heterogeneous MAR policy 40 chosen when the operation mode indicator table 104 is set to dynamic mode. When the operation mode indicator table 104 is set to dynamic mode the bus interconnect arbiter 24 will first check in the MAR dynamic profile table 38 in FIG. 15 discussed below, to see if a valid memory access request dynamic profile entry exists for the master device 12(0-M) making the request. If there is a valid profile for the requesting master device 12(0-M), the bus interconnect arbiter 24 will analyze the MAR dynamic profile table 38 based on the MAR dynamic profile entry returned for the master device 12(0-M) (block 170). Based on the analysis performed at block 170, the exemplary process will determine the applicable MAR policy to apply based on the MAR dynamic profile (block 172). Once the heterogeneous MAR policy 40 is determined, the process will apply the dynamic memory access write request based on the heterogeneous MAR policy (block 174).

Figure 11B:
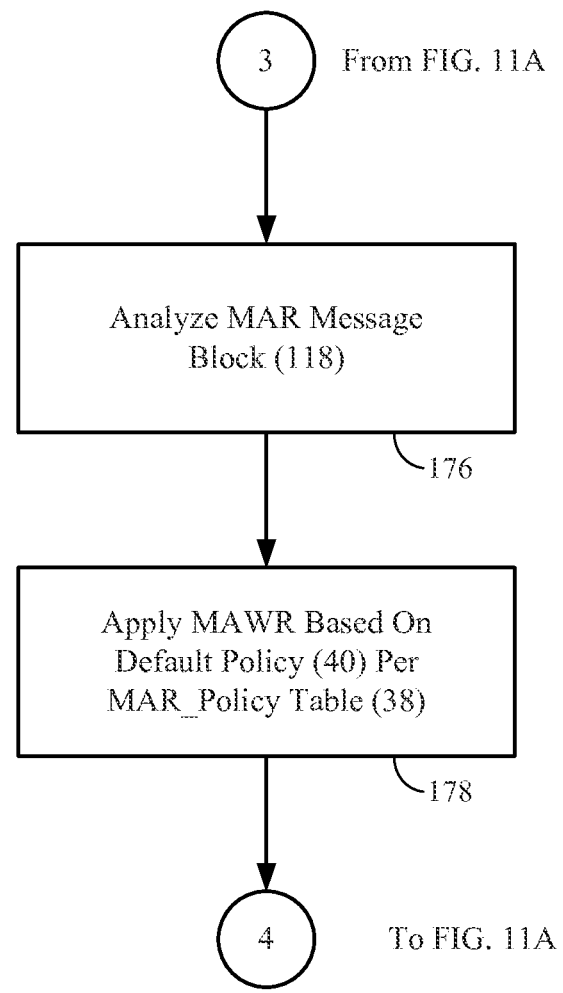
FIG. 11B is a flowchart of an exemplary process for processing a default memory access write request policy for a memory access request in a heterogeneous memory system if a valid dynamic memory access request policy profile is determined to not be present in the exemplary process of FIG. 11A.

The flowchart in FIG. 11B describes the process if there is no valid profile for the requesting master device 12(0-M). In such a case, the bus interconnect arbiter 24 will analyze the master_ID 110 based on the default heterogeneous MAR policy 40 (block 176). The bus interconnect arbiter 24 then applies the default heterogeneous MAR policy 40 (block 178). Upon completion of this exception to the dynamic memory access request policy where no valid dynamic profile exists, the bus interconnect arbiter 24 returns to receive the next memory access request (MAR) (block 94 of FIG. 7). If the memory access request transaction is not a write transaction (as was discussed above in FIGS. 8-11B), the memory access request will be determined to be a memory access read request as determined in block 96 of FIG. 7 based on the read/write indicator 120 in FIG. 9A.

Figure 12:
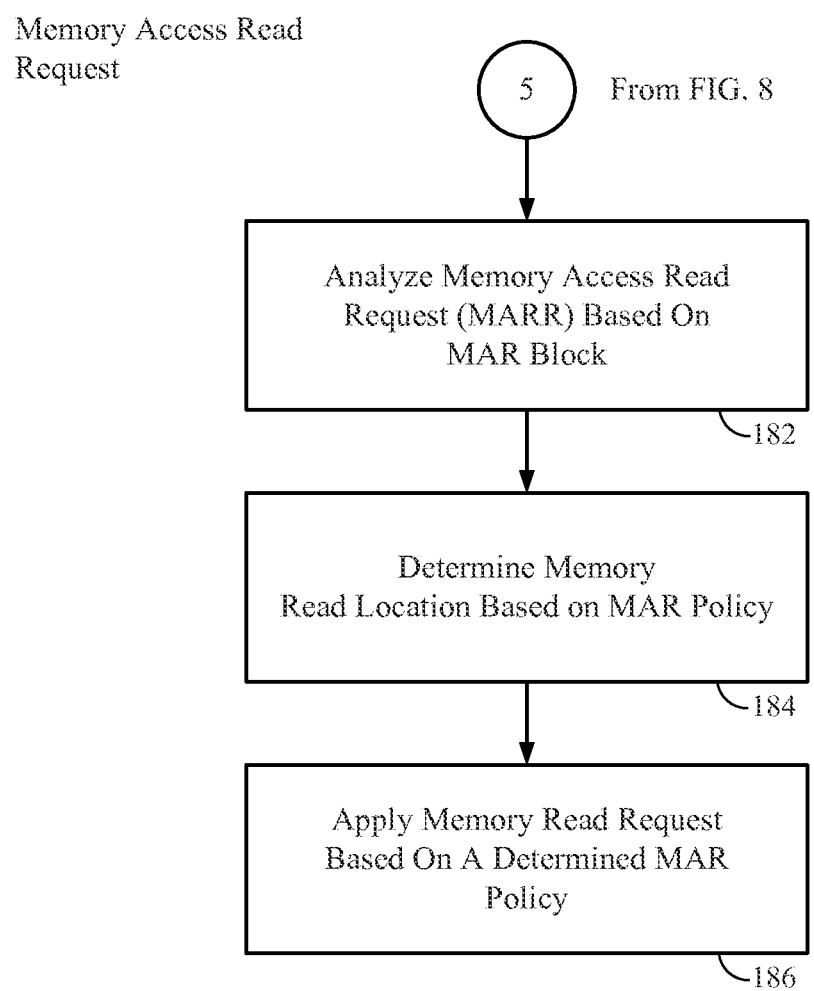
FIG. 12 is a flowchart of an exemplary process for processing a memory access read request in a processor-based system that includes a heterogeneous memory system.

In this regard, FIG. 12 illustrates the exemplary memory access read request (MARR) as determined in block 96 of FIG. 7. The bus interconnect arbiter 24 reads the read/write indicator 120 of FIG. 9A in the MAR message block 118 and determines if the MAR message block 118 is a read or a write transaction. If the read/write indicator 120 indicates a read transaction, the bus interconnect arbiter 24 proceeds with the exemplary process as illustrated in FIG. 12. The bus interconnect arbiter 24 will initially analyze the MAR message block 118 (block 182), determining the master_ID 110 and the stream_ID block 124. The bus interconnect arbiter 24 then determines the proper memory read location based on the MAR policy determined by the static heterogeneous MAR policy table 36 (block 184). Once determined, the bus interconnect arbiter 24 may then apply the memory read request based on a determined MAR policy (block 186).

Figure 13:
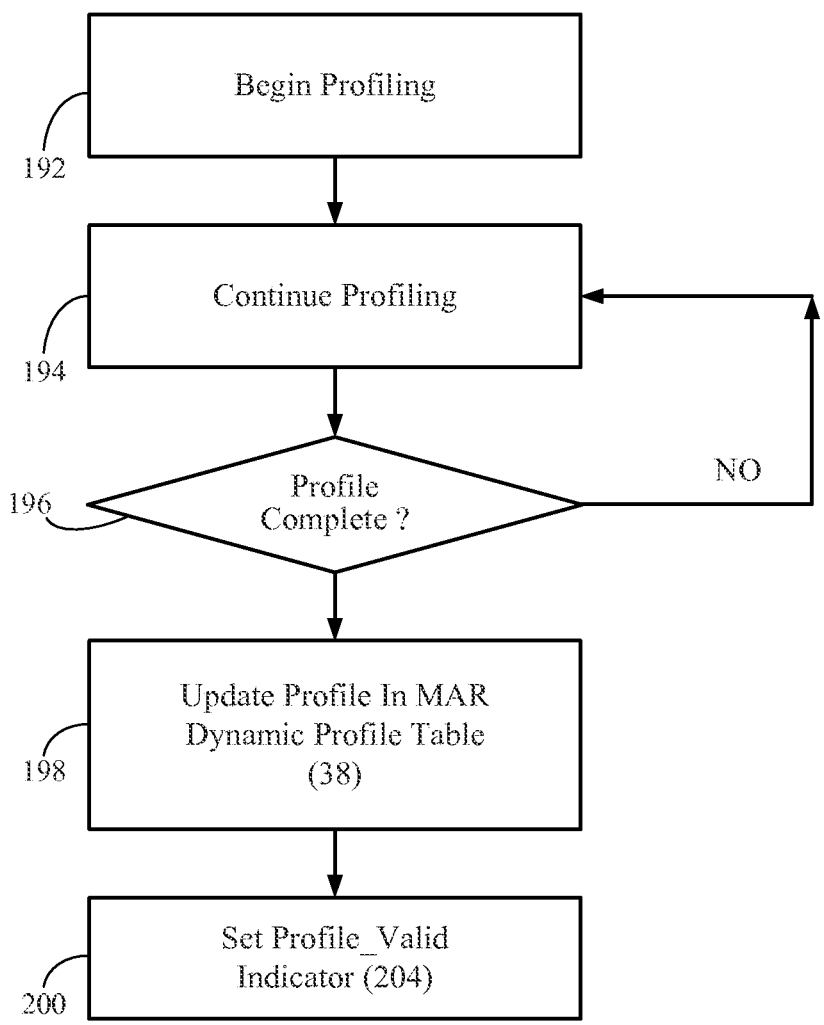
FIG. 13 is a flowchart of an exemplary process for performing dynamic operational profiling for determining dynamic memory access request policies.

Memory access requests that are static in nature, that is, they are predetermined and do not adjust or change based on run-time conditions, are based on the default heterogeneous MAR policy table 36 in FIG. 8C. These may be either predetermined by the master devices 12(0-M) or associated applications. If, however, the operation mode indicator setting 106 sets the processor-based system to a dynamic mode that calls for dynamic profiling, the system must determine MAR policies based run-time conditions. In this regard, FIG. 13 is a flowchart that illustrates the creation of a valid profile for updating of the MAR dynamic profile table 38 for use in applying dynamic memory access request policies in a dynamic mode of operation. The bus interconnect arbiter 24 begins the process of profiling system operations (block 192). The profiling may require some measure of time to properly characterize page hit ratios, memory traffic, et cetera, as discussed further in FIG. 14 below. The profiling continues (block 194) until the bus interconnect arbiter 24 determines that the profile is complete (block 196). Once complete, the bus interconnect arbiter 24 updates a heterogeneous MAR dynamic profile table 38 (block 198). The bus interconnect arbiter 24 also sets a profile_valid indicator (block 200) as discussed in greater detail below.

Referring now to FIG. 14, the MAR dynamic profile table 38 contains the valid dynamic profile information necessary to make heterogeneous MAR policy determinations based on gathered and/or measured system operation information. The use of this MAR dynamic profile table 38 is determined by the operation mode indicator setting 106. If the operation mode indicator setting 106 is set to the static mode of operation then MAR dynamic profile table 38 may not be used. However, if the operation mode indicator setting 106 is set to the dynamic mode of operation, the bus interconnect arbiter 24 may use various system operational performance measures and update the MAR dynamic profile table 38 with valid profiles as needed. A MSTR_ID/APP #202 is an index number which may be used to identify and age the updated profiles. For instance, profiles are likely needed to be current in order to be valid. The bus interconnect arbiter 24 may use this field to timestamp and order, or rank, the profile entries. A profile_valid indicator field 204 is a listing of the master_IDs 110. For example, when looking for a valid profile based on a requesting master device 12(0-M), a valid profile may be determined by finding a valid profile associated with that master device 12(0-M).

With further reference to FIG. 14, both the master_ID 110 and a parsed application identifier (Application_ID) 132 may be stored for easier lookup. The MAR dynamic profile table 38 may also support application specific parameters, for example, an application or a master device 12(0-M) priority field (PRIORITY) 144, or a deadline field (DEADLINE) 142, as previously discussed in FIG. 9A. The MAR dynamic profile table 38 may also support system performance parameters, for example, power priority 206, which may give an indication of either the current battery charge level or the required system run-time priority of the processor-based system. A Read/Write priority 208 provides an indication of the priority that the master device 12(0-M) may give to read/write performance. As an example, if the power priority 206 is higher than the R/W priority 208, the bus interconnect arbiter 24 may make a heterogeneous MAR policy 40 determination that chooses a more energy-efficient homogeneous memory unit. That is, the required system run-time may require that the battery charge level remain at a higher priority than any other performance consideration. However, if read/write performance is a higher priority, the bus interconnect arbiter 24 can make a policy determination to read or write to the highest performing homogeneous memories 28(0-A) available, potentially at the expense of the battery charge level.

Additionally, in FIG. 14, the processor-based system may measure a page hit ratio 210 and a memory traffic field 212, among other system performance parameters. The page hit ratio 210 is an indication of how random the memory access request is. A static heterogeneous MAR policy may, for example, determine that the master device 12(0-M), or an application, should read or write by default to volatile memory. However, based on recent behavior of the master device 12(0-M), a determination may be made that the master device 12(0-M) is operating with more random reads and writes. In this case, the bus interconnect arbiter 24 may determine that performance would be enhanced by instead reading and writing to non-volatile memory. The memory traffic field 212 may also be used to determine if the current master device 12(0-M) or application behavior is functioning with read and writes to larger contiguous blocks of memory, even though, typically, the master device 12(0-M) makes more random reads and writes. In this example, the default may be to read and write to non-volatile memory, however, because of the change in behavior, the bus interconnect arbiter 24 may determine that it would be better to use volatile memory and update the MAR dynamic profile table 38 accordingly.

The heterogeneous memory systems, and related methods and computer-readable media, according to embodiments disclosed herein, may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 15:
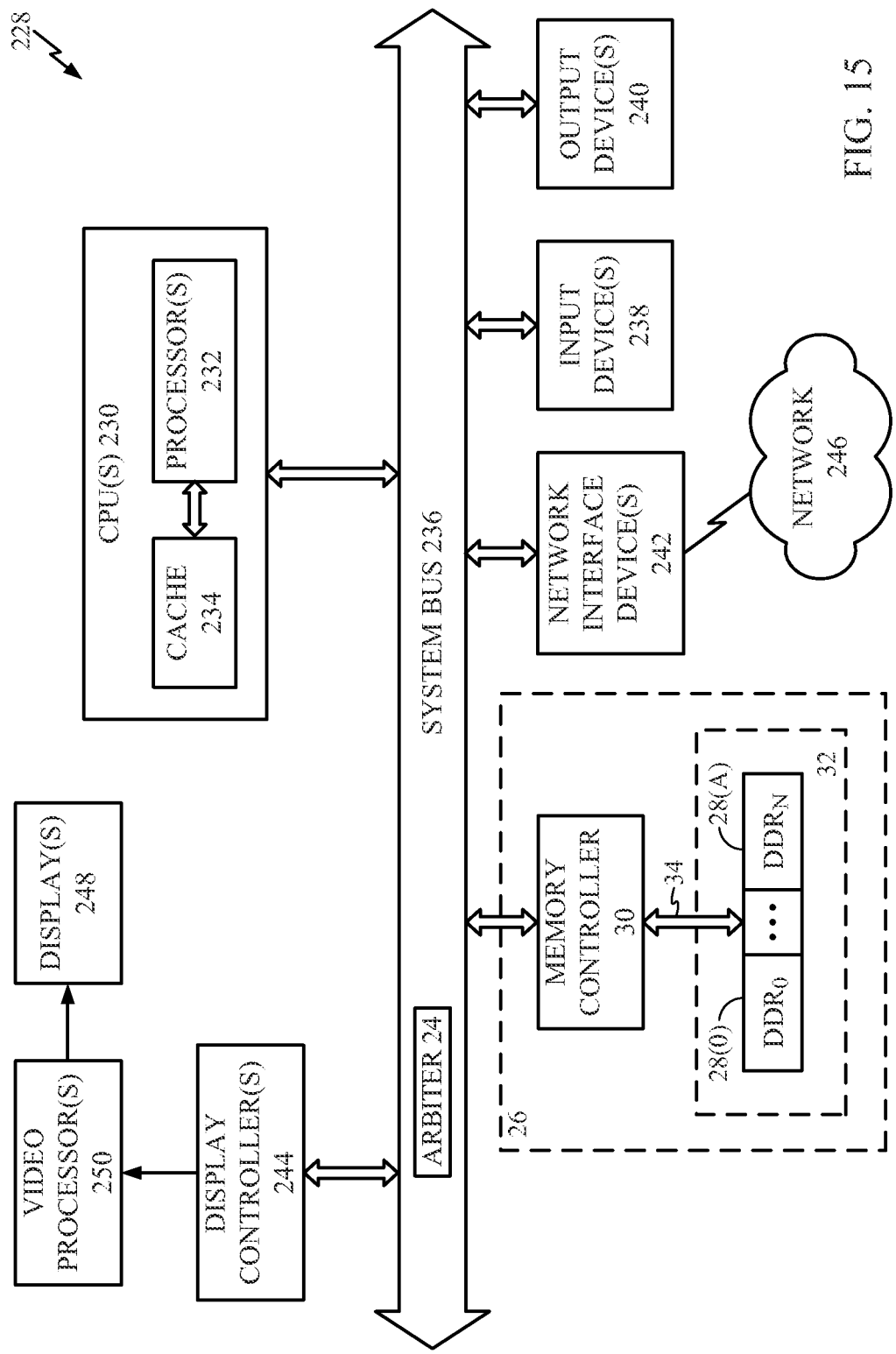
FIG. 15 is a block diagram of an exemplary processor-based system that includes a heterogeneous memory system, including but not limited to the heterogeneous memory systems of FIGS. 1 and 4.

In this regard, FIG. 15 illustrates an example of a processor-based system 228 that can employ heterogeneous memory systems, and related methods and computer-readable media for supporting heterogeneous memory access requests in the processor-based systems 10, 10' illustrated in FIGS. 1 and 4. In this example, the processor-based system 228 includes one or more central processing units (CPUs) 230, each including one or more processors 232. The CPU(s) 230 may be a master device 12(0-M). The CPU(s) 230 may have cache memory 234 coupled to the processor(s) 232 for rapid access to temporarily stored data. The CPU(s) 230 is coupled to a system bus 236 and can intercouple master and slave devices included in the processor-based system 228. The system bus 236 may be a bus interconnect like the bus interconnect 16 illustrated in FIGS. 1 and 4. As is well known, the CPU(s) 230 communicates with these other devices by exchanging address, control, and data information over the system bus 236. For example, the CPU(s) 230 can communicate bus transaction requests to the memory controller 30 as an example of a slave device. Although not illustrated in FIG. 15, multiple system buses 236 could be provided, wherein each system bus 236 constitutes a different fabric.

Other master and slave devices can be connected to the system bus 236. As illustrated in FIG. 15, these devices can include at least one heterogeneous memory system 26, one or more input devices 238, one or more output devices 240, one or more network interface devices 242, and one or more display controllers 244, as examples. The input device(s) 238 can include any type of input device, including but not limited to input keys, switches, voice processors, etc. The output device(s) 240 can include any type of output device, including but not limited to audio, video, other visual indicators, etc. The network interface device(s) 242 can be any devices configured to allow exchange of data to and from a network 246. The network 246 can be any type of network, including but not limited to a wired or wireless network, a private or public network, a local area network (LAN), a wide local area network (WLAN), and the Internet. The network interface device(s) 242 can be configured to support any type of communication protocol desired. The at least one heterogeneous memory system 26 can include one or more homogeneous memories 28(0-A). The bus interconnect arbiter 24 may be provided between the system bus 236 and master and slave devices coupled to the system bus 236, for example, the one or more homogeneous memories 28(0-A) provided in the at least one heterogeneous memory system 26.

The CPU(s) 230 may also be configured to access the display controller(s) 244 over the system bus 236 to control information sent to one or more displays 248. The display controller(s) 244 sends information to the display(s) 248 to be displayed via one or more video processors 250, which process the information to be displayed into a format suitable for the display(s) 248. The display(s) 248 can include any type of display, including but not limited to a cathode ray tube (CRT), a liquid crystal display (LCD), a plasma display, etc.

The CPU(s) 230 and the display controller(s) 244 may act as master devices to make memory access requests to the bus interconnect arbiter 24 over the system bus 236. Different threads within the CPU(s) 230 and the display controller(s) 244 may make requests to the bus interconnect arbiter 24.

Those skilled in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a DSP, an Application Specific Integrated Circuit (ASIC), an FPGA or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those skilled in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A bus interconnect arbiter for routing memory access requests to a heterogeneous memory system in a processor-based system, wherein the bus interconnect arbiter is configured to:
   receive a memory access request in a bus interconnect from a requesting device;
   determine, based on performance characteristics associated with the memory access request, a homogeneous memory type among a plurality of homogeneous memory types within a heterogeneous memory system coupled to the bus interconnect, by being further configured to:
      determine, based on the memory access request, a memory access request policy among a plurality of heterogeneous memory access request policies, each memory access request policy corresponding to the homogeneous memory type among the plurality of homogeneous memory types, and each memory access request policy being one of a static heterogeneous memory access request policy and a dynamic heterogeneous memory access request policy; and
      determine the homogeneous memory type corresponding to the determined memory access request policy; and
   route the memory access request to a homogeneous memory of a plurality of homogeneous memories in the heterogeneous memory system corresponding to the determined homogeneous memory type.

2. The bus interconnect arbiter of claim 1, wherein the plurality of homogeneous memories are comprised of a Dynamic Random Access Memory (DRAM) homogeneous memory and a Magnetoresistive Random Access Memory (MRAM) homogeneous memory.

3. The bus interconnect arbiter of claim 1, wherein each of the plurality of homogeneous memories is either a volatile memory or a non-volatile memory within the heterogeneous memory system.

4. The bus interconnect arbiter of claim 1, wherein, to determine the memory access request policy, the bus interconnect arbiter is configured to:
   determine that the memory access request corresponds to a static heterogeneous memory access request; and
   determine the memory access request policy as the static heterogeneous memory access request policy based on a static memory access request policy look-up in a memory access request policy table.

5. The bus interconnect arbiter of claim 1, wherein, to determine the memory access request policy, the bus interconnect arbiter is configured to:
   determine that the memory access request corresponds to a static heterogeneous memory access request; and
   determine the memory access request policy as the static heterogeneous memory access request policy based on a master identifier in the memory access request.

6. The bus interconnect arbiter of claim 1, wherein, to determine the memory access request policy, the bus interconnect arbiter is configured to:
   determine that the memory access request corresponds to a static heterogeneous memory access request; and
   determine the memory access request policy as the static heterogeneous memory access request policy based on an application identifier in the memory access request.

7. The bus interconnect arbiter of claim 1, wherein, to determine the memory access request policy, the bus interconnect arbiter is configured to:
   determine that the memory access request corresponds to a dynamic heterogeneous memory access request; and
   determine the memory access request policy as the dynamic heterogeneous memory access request policy based on a dynamic memory access request policy look-up in a dynamic heterogeneous memory access request profile look-up table.

8. The bus interconnect arbiter of claim 1, wherein, to determine the memory access request policy, the bus interconnect arbiter is configured to:
   determine that the memory access request corresponds to a dynamic heterogeneous memory access request; and
   determine the memory access request policy as the dynamic heterogeneous memory access request policy based on a memory access request priority in the memory access request.

9. The bus interconnect arbiter of claim 1, wherein, to determine the memory access request policy, the bus interconnect arbiter is configured to:
   determine that the memory access request corresponds to a dynamic heterogeneous memory access request; and
   determine the memory access request policy as the dynamic heterogeneous memory access request policy based on a memory access request deadline in the memory access request.

10. The bus interconnect arbiter of claim 1, wherein, to determine the memory access request policy, the bus interconnect arbiter is configured to:
    determine that the memory access request corresponds to a dynamic heterogeneous memory access request; and
    determine the memory access request policy as the dynamic heterogeneous memory access request policy based on a power mode in the processor-based system.

11. The bus interconnect arbiter of claim 1, wherein, to determine the memory access request policy, the bus interconnect arbiter is configured to:
    determine that the memory access request corresponds to a dynamic heterogeneous memory access request; and
    determine the memory access request policy as the dynamic heterogeneous memory access request policy based on a memory page hit ratio.

12. The bus interconnect arbiter of claim 1, wherein, to determine the memory access request policy, the bus interconnect arbiter is configured to:

determine that the memory access request corresponds to a dynamic heterogeneous memory access request; and determine the memory access request policy as the dynamic heterogeneous memory access request policy based on memory access request traffic.

13. The bus interconnect arbiter of claim 1, wherein, to determine the memory access request policy, the bus interconnect arbiter is configured to:

determine that the memory access request corresponds to a dynamic heterogeneous memory access request; and determine the memory access request policy as a dynamic heterogeneous memory access request policy profile based on at least one operational parameter selected from the group consisting of: application priority; a memory access request deadline; a power-mode; a memory page hit ratio; and memory access request traffic.

14. The bus interconnect arbiter of claim 1, wherein, to determine the memory access request policy, the bus interconnect arbiter is configured to:

determine if a valid operational profile of the processor-based system is present; and determine the memory access request policy as a default memory access request policy if the valid operational profile is not present.

15. The bus interconnect arbiter of claim 1 disposed in the bus interconnect.

16. The bus interconnect arbiter of claim 1 integrated into a semiconductor die.

17. The bus interconnect arbiter of claim 1, further comprising a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player, into which the bus interconnect arbiter is integrated.

18. A bus interconnect arbiter for routing memory access requests to a heterogeneous memory system in a processor-based system, wherein the bus interconnect arbiter comprises:

means for receiving a memory access request in a bus interconnect from a requesting device;

means for determining, based on performance characteristics associated with the memory access request, a homogeneous memory type among a plurality of homogeneous memory types within a heterogeneous memory system coupled to the bus interconnect, wherein the means for determining the homogeneous memory type comprises:

means for determining, based on the memory access request, a memory access request policy among a plurality of heterogeneous memory access request policies, each memory access request policy corresponding to the homogeneous memory type among the plurality of homogeneous memory types, and each memory access request policy being one of a static heterogeneous memory access request policy and a dynamic heterogeneous memory access request policy; and means for determining the homogeneous memory type corresponding to the determined memory access request policy; and means for routing the memory access request to a homogeneous memory of a plurality of heterogeneous memories in the heterogeneous memory system corresponding to the determined homogeneous memory type.

19. A heterogeneous memory system coupled to a bus interconnect in a processor-based system, wherein the heterogeneous memory system comprises:

a first homogeneous memory coupled to a first memory channel of a memory controller, wherein the first homogeneous memory is a volatile memory type; and a second homogeneous memory coupled to a second memory channel of the memory controller, wherein the second homogeneous memory is a non-volatile memory type;

the memory controller configured to:

receive memory access requests in a bus interconnect, the memory controller having the first memory channel and the second memory channel;

determine, based on performance characteristics associated with the memory access requests, a homogeneous memory type among a plurality of homogeneous memory types within the heterogeneous memory system coupled to the bus interconnect, by being further configured to:

determine, based on the memory access requests, a memory access request policy among a plurality of heterogeneous memory access request policies, each memory access request policy corresponding to the homogeneous memory type among the plurality of homogeneous memory types, and each memory access request policy being one of a static heterogeneous memory access request policy and a dynamic heterogeneous memory access request policy; and determine the homogeneous memory type corresponding to the determined memory access request policy; and route the memory access requests to either the first homogenous memory or the second homogeneous memory coupled to the bus interconnect corresponding to the determined homogeneous memory type.

20. The heterogeneous memory system of claim 19, wherein the first homogeneous memory is comprised of Dynamic Random Access Memory (DRAM) and the second homogeneous memory is comprised of Magnetoresistive Random Access Memory (MRAM).

21. The heterogeneous memory system of claim 19, wherein, to determine the memory access request policy, the memory controller is further configured to:

determine that the memory access requests correspond to static heterogeneous memory access requests; and determine the memory access request policy as the static heterogeneous memory access request policy based on a static memory access request policy look-up in a memory access request policy table.

22. The heterogeneous memory system of claim 19, wherein, to determine the memory access request policy, the memory controller is further configured to:

determine that the memory access requests correspond to dynamic heterogeneous memory access requests; and determine the memory access request policy as the dynamic heterogeneous memory access request policy based on a dynamic memory access request policy look-up in a dynamic heterogeneous memory access request profile look-up table.

23. The heterogeneous memory system of claim 19, wherein, to determine the memory access request policy, the memory controller is further configured to:
  determine that the memory access requests correspond to dynamic heterogeneous memory access requests; and
  determine the memory access request policy as the dynamic heterogeneous memory access request policy based on memory access request priorities in the memory access requests.

24. The heterogeneous memory system of claim 19, wherein, to determine the memory access request policy, the memory controller is further configured to:
  determine that the memory access requests correspond to dynamic heterogeneous memory access requests; and
  determine the memory access request policy as the dynamic heterogeneous memory access request policy based on memory access request deadlines in the memory access requests.

25. A heterogeneous memory system coupled to a bus interconnect in a processor-based system, the heterogeneous memory system including a memory controller comprising:
  means for receiving memory access requests in a bus interconnect having a first memory channel and a second memory channel, wherein the means for receiving the memory access requests comprises means for determining, based on performance characteristics associated with the memory access requests, a homogeneous memory type among a plurality of homogeneous memory types within the heterogeneous memory system coupled to the bus interconnect, wherein the means for determining the homogeneous memory type comprises:
    means for determining, based on the memory access requests, a memory access request policy among a plurality of heterogeneous memory access request policies, each memory access request policy corresponding to the homogeneous memory type among the plurality of homogeneous memory types, and each memory access request policy being one of a static heterogeneous memory access request policy and a dynamic heterogeneous memory access request policy; and
    means for determining the homogeneous memory type corresponding to the determined memory access request policy; and
  means for routing the memory access requests to either a first homogeneous memory coupled to the first memory channel of the bus interconnect, wherein the first homogeneous memory is a volatile memory type, or to a second homogeneous memory coupled to the second memory channel of the bus interconnect, wherein the second homogeneous memory is a non-volatile memory type, based on the determined homogeneous memory type.

26. A processor-based system, comprising:
  a bus interconnect coupled to at least one requesting device, the bus interconnect comprising a bus interconnect arbiter configured to route received memory access requests from the at least one requesting device to heterogeneous memory systems;
  a first homogeneous memory system coupled to the bus interconnect, wherein the first homogeneous memory system is a volatile memory type; and
  a second homogeneous memory system coupled to the bus interconnect, wherein the second homogeneous memory system is a non-volatile memory type;
  wherein the bus interconnect arbiter is configured to:
    receive the memory access requests in the bus interconnect from the at least one requesting device;
    determine, based on performance characteristics associated with the memory access requests, either the first homogeneous memory system or the second homogeneous memory system coupled to the bus interconnect, by being further configured to:
      determine, based on the memory access requests, a memory access request policy among a plurality of heterogeneous memory access request policies, each memory access request policy corresponding to a homogeneous memory type among a plurality of homogeneous memory types, and each memory access request policy being one of a static heterogeneous memory access request policy and a dynamic heterogeneous memory access request policy; and
      determine the homogeneous memory type corresponding to the determined memory access request policy; and
    route the memory access requests to a homogeneous memory among the first homogeneous memory system or the second homogeneous memory system coupled to the bus interconnect corresponding to the determined homogeneous memory type.

27. The processor-based system of claim 26, wherein the first homogeneous memory system is comprised of Dynamic Random Access Memory (DRAM) homogeneous memory and the second homogeneous memory system is comprised of Magnetoresistive Random Access Memory (MRAM) homogeneous memory.

28. The processor-based system of claim 26, wherein, to determine the memory access request policy, the bus interconnect arbiter is further configured to:
  determine that the memory access requests correspond to static heterogeneous memory access requests; and
  determine the memory access request policy as the static heterogeneous memory access request policy based on a static memory access request policy look-up in a memory access request policy table.

29. The processor-based system of claim 26, wherein, to determine the memory access request policy, the bus interconnect arbiter is further configured to:
  determine that the memory access requests correspond to dynamic heterogeneous memory access requests; and
  determine the memory access request policy as the dynamic heterogeneous memory access request policy based on a dynamic memory access request policy look-up in a dynamic heterogeneous memory access request profile look-up table.

30. The processor-based system of claim 26, wherein, to determine the memory access request policy, the bus interconnect arbiter is further configured to:
  determine that the memory access requests correspond to dynamic heterogeneous memory access requests; and
  determine the memory access request policy as the dynamic heterogeneous memory access request policy based on memory access request priorities in the memory access requests.

31. The processor-based system of claim 26, wherein, to determine the memory access request policy, the bus interconnect arbiter is further configured to:
  determine that the memory access requests correspond to dynamic heterogeneous memory access requests; and determine the memory access request policy as the dynamic heterogeneous memory access request policy based on memory access request deadlines in the memory access requests.

32. A method of a bus interconnect arbiter for routing memory access requests to a heterogeneous memory system in a processor-based system, comprising:
receiving a memory access request in a bus interconnect from a requesting device;
determining, based on performance characteristics associated with the memory access request, a homogeneous memory type among a plurality of homogeneous memory types within a heterogeneous memory system coupled to the bus interconnect, wherein determining the homogeneous memory type comprises:
determining, based on the memory access request, a memory access request policy among a plurality of heterogeneous memory access request policies, each memory access request policy corresponding to the homogeneous memory type among the plurality of homogeneous memory types, and each memory access request policy being one of a static heterogeneous memory access request policy and a dynamic heterogeneous memory access request policy; and
determining the homogeneous memory type corresponding to the determined memory access request policy; and
routing the memory access request to a homogeneous memory of a plurality of homogeneous memories in the heterogeneous memory system corresponding to the determined homogeneous memory type.

33. The method of claim 32, wherein, each of the plurality of homogeneous memories is either a volatile memory or a non-volatile memory within the heterogeneous memory system.

34. The method of claim 32, wherein determining the memory access request policy comprises:
determining that the memory access request corresponds to a static heterogeneous memory access request; and
determining the memory access request policy as the static heterogeneous memory access request policy based on a static memory access request policy look-up in a memory access request policy table.

35. The method of claim 32, wherein determining the memory access request policy comprises:
determining that the memory access request corresponds to a static heterogeneous memory access request; and
determining the memory access request policy as the static heterogeneous memory access request policy based on a master identifier in the memory access request.

36. The method of claim 32, wherein determining the memory access request policy comprises:
determining that the memory access request corresponds to a static heterogeneous memory access request; and
determining the memory access request policy as the static heterogeneous memory access request policy based on an application identifier in the memory access request.

37. The method of claim 32, wherein determining the memory access request policy comprises:
determining that the memory access request corresponds to a dynamic heterogeneous memory access request; and
determining the memory access request policy as the dynamic heterogeneous memory access request policy based on a dynamic memory access request policy look-up in a dynamic heterogeneous memory access request profile look-up table.

38. The method of claim 32, wherein determining the memory access request policy comprises:
determining that the memory access request corresponds to a dynamic heterogeneous memory access request; and
determining the memory access request policy as the dynamic heterogeneous memory access request policy based on a memory access request priority in the memory access request.

39. The method of claim 32, wherein determining the memory access request policy comprises:
determining that the memory access request corresponds to a dynamic heterogeneous memory access request; and
determining the memory access request policy as the dynamic heterogeneous memory access request policy based on a memory access request deadline in the memory access request.

40. The method of claim 32, wherein determining the memory access request policy comprises:
determining that the memory access request corresponds to a dynamic heterogeneous memory access request; and
determining the memory access request policy as the dynamic heterogeneous memory access request policy based on a power mode in the processor-based system.

41. The method of claim 32, wherein determining the memory access request policy comprises:
determining that the memory access request corresponds to a dynamic heterogeneous memory access request; and
determining the memory access request policy as the dynamic heterogeneous memory access request policy based on a memory page hit ratio.

42. The method of claim 32, wherein determining the memory access request policy comprises:
determining that the memory access request corresponds to a dynamic heterogeneous memory access request; and
determining the memory access request policy as the dynamic heterogeneous memory access request policy based on memory access request traffic.

43. The method of claim 32, wherein determining the memory access request policy comprises:
determining that the memory access request corresponds to a dynamic heterogeneous memory access request; and
determining the memory access request policy as a dynamic heterogeneous memory access request policy profile based on at least one operational parameter selected from the group consisting of: application priority; a memory access request deadline; a power-mode; a memory page hit ratio; and memory access request traffic.

44. The method of claim 32, wherein determining the memory access request policy comprises:
determining if a valid operational profile of the processor-based system is present; and
determining the memory access request policy as a default memory access request policy if the valid operational profile is not present.

45. A non-transitory computer-readable medium having stored thereon computer-executable instructions to cause a bus interconnect arbiter for routing memory access requests to a heterogeneous memory system in a processor-based system to:
receive a memory access request in a bus interconnect from a requesting device;
determine, based on performance characteristics associated with the memory access request, a homogeneous memory type among a plurality of homogeneous memory types within a heterogeneous memory system coupled to the bus interconnect, by being configured to:

determine, based on the memory access request, a memory access request policy among a plurality of heterogeneous memory access request policies, each memory access request policy corresponding to the homogeneous memory type among the plurality of homogeneous memory types, and each memory access request policy being one of a static heterogeneous memory access request policy and a dynamic heterogeneous memory access request policy; and determine the homogeneous memory type corresponding to the determined memory access request policy; and route the memory access request to a homogeneous memory of a plurality of homogeneous memories in the heterogeneous memory system corresponding to the determined homogeneous memory type.

46. The non-transitory computer-readable medium of claim 45, wherein the plurality of homogeneous memories are comprised of a Dynamic Random Access Memory (DRAM) homogeneous memory and a Magnetoresistive Random Access Memory (MRAM) homogeneous memory.

47. The non-transitory computer-readable medium of claim 45, having stored thereon computer-executable instructions to cause the bus interconnect arbiter to determine the memory access request policy by further causing the bus interconnect arbiter to:

determine that the memory access request corresponds to a static heterogeneous memory access request; and determine the memory access request policy as the static heterogeneous memory access request policy based on a static memory access request policy look-up in a memory access request policy table.

48. The non-transitory computer-readable medium of claim 45, having stored thereon computer-executable instructions to cause the bus interconnect arbiter to determine the memory access request policy by further causing the bus interconnect arbiter to:

determine that the memory access request corresponds to a dynamic heterogeneous memory access request; and determine the memory access request policy as the dynamic heterogeneous memory access request policy based on a dynamic memory access request policy look-up in a dynamic heterogeneous memory access request profile look-up table.

49. The non-transitory computer-readable medium of claim 45, having stored thereon computer-executable instructions to cause the bus interconnect arbiter to determine the memory access request policy by further causing the bus interconnect arbiter to:

determine that the memory access request corresponds to a dynamic heterogeneous memory access request; and determine the memory access request policy as the dynamic heterogeneous memory access request policy based on a memory access request priority in the memory access request.

50. The non-transitory computer-readable medium of claim 45, having stored thereon computer-executable instructions to cause the bus interconnect arbiter to determine the memory access request policy by further causing the bus interconnect arbiter to:

determine that the memory access request corresponds to a dynamic heterogeneous memory access request; and determine the memory access request policy as the dynamic heterogeneous memory access request policy based on a memory access request deadline in the memory access request.

* * * * *

UNITED STATES PATENT AND TRADEMARK OFFICE
CERTIFICATE OF CORRECTION

PATENT NO. : 9,224,452 B2
APPLICATION NO. : 13/743400
DATED : December 29, 2015
INVENTOR(S) : Xiangyu Dong et al.

It is certified that error appears in the above-identified patent and that said Letters Patent is hereby corrected as shown below:

Claim 18, at column 22, line 2, change "heterogeneous" to --homogeneous--.

Signed and Sealed this
Twenty-eighth Day of June, 2016

Michelle K. Lee
*Director of the United States Patent and Trademark Office*